US012777691B2

(12) United States Patent
Yoo et al.

(10) Patent No.: US 12,777,691 B2
(45) Date of Patent: Oct. 27, 2026

(54) SEMICONDUCTOR DEVICE INCLUDING BLOCKING LAYER AND SOURCE/DRAIN STRUCTURE

(71) Applicant: SAMSUNG ELECTRONICS CO., LTD., Suwon-si (KR)

(72) Inventors: Jongryeol Yoo, Suwon-si (KR); Jungtaek Kim, Suwon-si (KR)

(73) Assignee: SAMSUNG ELECTRONICS CO., LTD., Suwon-si (KR)

(*) Notice: Subject to any disclaimer, the term of this patent is extended or adjusted under 35 U.S.C. 154(b) by 348 days.

(21) Appl. No.: 18/378,874

(22) Filed: Oct. 11, 2023

(65) Prior Publication Data

US 2024/0128321 A1 Apr. 18, 2024

(30) Foreign Application Priority Data

Oct. 12, 2022 (KR) ........................ 10-2022-0130712

(51) Int. Cl.
*H10D 62/13* (2025.01)
*H10D 30/01* (2025.01)
(Continued)

(52) U.S. Cl.
CPC ......... *H10D 62/151* (2025.01); *H10D 30/014* (2025.01); *H10D 30/43* (2025.01);
(Continued)

(58) Field of Classification Search
CPC .... H10D 62/151; H10D 30/014; H10D 30/43; H10D 30/6735; H10D 62/121;
(Continued)

(56) References Cited

U.S. PATENT DOCUMENTS

2017/0256610 A1 9/2017 Guillorn et al.
2018/0366544 A1* 12/2018 Chang .................. H10D 62/151
(Continued)

FOREIGN PATENT DOCUMENTS

KR 10-2019-0078818 A 7/2019
KR 10-2021-0032845 A 3/2021
KR 10-2022-0022576 A 2/2022

*Primary Examiner* — Syed I Gheyas
(74) *Attorney, Agent, or Firm* — Sughrue Mion, PLLC

(57) ABSTRACT

A semiconductor device includes an active region including a first portion and a second portion; an isolation region on a side surface of the active region; a plurality of active layers stacked and spaced apart from each other in a vertical direction on the first portion of the active region; an epitaxial structure disposed on the second portion of the active region, connected to the plurality of active layers, and overlapping the isolation region in the vertical direction; a gate structure extending by intersecting the active region and surrounding each of the plurality of active layers; and a gate spacer on a side surface of the gate structure. The epitaxial structure includes a blocking layer and a source/drain structure on the blocking layer. The blocking layer includes a plurality of active blocking portions contacting the plurality of active layers, respectively, and at least one first bent portion bent and extending from at least one of the plurality of active blocking portions and contacting the gate spacer.

20 Claims, 17 Drawing Sheets

(51) Int. Cl.

| | |
|---|---|
| ***H10D 30/43*** | (2025.01) |
| ***H10D 30/67*** | (2025.01) |
| ***H10D 62/10*** | (2025.01) |
| ***H10D 62/832*** | (2025.01) |
| ***H10D 64/01*** | (2025.01) |
| ***H10P 14/20*** | (2026.01) |

(52) U.S. Cl.
CPC ....... *H10D 30/6735* (2025.01); *H10D 62/121* (2025.01); *H10D 62/832* (2025.01); *H10D 64/017* (2025.01); *H10P 14/3411* (2026.01)

(58) Field of Classification Search
CPC ............... H10D 62/832; H10D 64/017; H10D 30/6757; H10D 62/113; H10D 62/112; H10D 30/62; H10D 64/671; H10D 30/6713; H01L 21/02532
See application file for complete search history.

(56) References Cited

U.S. PATENT DOCUMENTS

| | | | | |
|---|---|---|---|---|
| 2019/0198639 | A1* | 6/2019 | Kim .................. | H10D 30/6757 |
| 2020/0168716 | A1* | 5/2020 | Peng .................... | H10D 64/017 |
| 2020/0220015 | A1* | 7/2020 | Jang ..................... | H10D 30/031 |
| 2020/0381530 | A1* | 12/2020 | Chung ............... | H10D 30/6219 |
| 2021/0082914 | A1 | 3/2021 | Lee et al. | |
| 2021/0098605 | A1 | 4/2021 | Wang et al. | |
| 2021/0134952 | A1 | 5/2021 | Fung | |
| 2022/0052203 | A1 | 2/2022 | More | |
| 2022/0059530 | A1 | 2/2022 | Song et al. | |

* cited by examiner

SEMICONDUCTOR DEVICE INCLUDING BLOCKING LAYER AND SOURCE/DRAIN STRUCTURE

CROSS-REFERENCE TO RELATED APPLICATION(S)

This application is based on and claims priority to Korean Patent Application No. 10-2022-0130712 filed on Oct. 12, 2022 in the Korean Intellectual Property Office, the disclosure of which is incorporated herein in its entirety by reference.

BACKGROUND

Example embodiments of the present disclosure relate to a semiconductor device including a plurality of active layers, a blocking layer, and a source/drain structure.

As the demand for high performance, high speed, and/or multifunctionality of a semiconductor device has increased, integration density of a semiconductor device has also increased. In manufacturing a semiconductor device having a fine pattern corresponding to the trend for high integration of the semiconductor device, it has been necessary to implement patterns having a fine width or a fine spacing. Also, to address the limitations of operating properties due to the size reduction of a planar metal-oxide-semiconductor field-effect transistor (MOSFET), there have been attempts to develop a semiconductor device including a fin field-effect transistor (FinFET) having a three-dimensional channel structure.

SUMMARY

Example embodiments of the disclosure provide a semiconductor device which may prevent a leakage current in a transistor including a plurality of active layers vertically spaced apart from each other.

According to an embodiment, there is provided a semiconductor device which may include: an active region including a first portion and a second portion; an isolation region on a side surface of the active region; a plurality of active layers stacked and spaced apart from each other in a vertical direction and on the first portion of the active region; an epitaxial structure disposed on the second portion of the active region, connected to the plurality of active layers, and overlapping the isolation region in the vertical direction; a gate structure extending while intersecting the active region and surrounding each of the plurality of active layers; and a gate spacer on a side surface of the gate structure. The epitaxial structure includes a blocking layer and a source/drain structure on the blocking layer. The blocking layer includes a plurality of active blocking portions contacting the plurality of active layers, respectively, and at least one first bent portion bent and extending from at least one of the plurality of active blocking portions and contacting the gate spacer.

According to an embodiment, there is provided a semiconductor device which may include: an active region including a first portion and a second portion; an isolation region on a side surface of the active region; a plurality of active layers stacked and spaced apart from each other in a vertical direction and on the first portion of the active region; an epitaxial structure disposed on the second portion of the active region, connected to the plurality of active layers, and overlapping the isolation region in the vertical direction; a gate structure extending while intersecting the active region and surrounding each of the plurality of active layers; and a gate spacer on a side surface of the gate structure. The gate structure includes a plurality of lower gate portions disposed below the plurality of active layers, respectively, and an upper gate portion disposed on an upper active layer among the plurality of active layers. The epitaxial structure includes a blocking layer and a source/drain structure on the blocking layer. The blocking layer includes a lower blocking portion contacting the second portion of the active region, a plurality of active blocking portions contacting the plurality of active layers, respectively, a plurality of gate blocking portions contacting the lower gate portions, respectively, and at least one bent portion bent and extending from at least one of the plurality of active blocking portions, the plurality of gate blocking portions, and the lower blocking portion, and contacting the gate spacer.

According to an embodiment, there is provided a semiconductor device which may include: an active region including a first portion and a second portion; a plurality of active layers stacked and spaced apart from each other in a vertical direction and on the first portion of the active region; an epitaxial structure disposed on the second portion of the active region and electrically connected to the plurality of active layers; a gate structure extending while intersecting the active region and surrounding each of the plurality of active layers; and a gate spacer on a side surface of the gate structure. The gate structure includes a plurality of lower gate portions disposed below the plurality of active layers, respectively, and an upper gate portion disposed on an upper active layer among the plurality of active layers. The epitaxial structure includes a blocking layer and a source/drain structure on the blocking layer. The blocking layer includes a lower blocking portion contacting the second portion of the active region, a plurality of active blocking portions contacting the plurality of active layers, respectively, a plurality of gate blocking portions contacting the lower gate portions, respectively, and at least one bent portion bent and extending horizontally from at least one of the plurality of active blocking portions and the plurality of gate blocking portions and contacting the gate spacer.

BRIEF DESCRIPTION OF DRAWINGS

The above and other aspects, features, and advantages of the disclosure will be more clearly understood from the following detailed description, taken in combination with the accompanying drawings, in which.

DETAILED DESCRIPTION

Hereinafter, embodiments of the present disclosure will be described as follows with reference to the accompanying drawings.

Hereinafter, spatially relative terms such as "upper," "middle," "lower", "vertical", "horizontal", and/or the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. Terms such as "first," "second," and "third" may be used to describe various elements. These terms are used to distinguish one element from another element, but the elements are not otherwise limited by the terms. For example, a "first element" may be termed a "second element" without departing from the scope of the disclosure. As used herein, an expression "at least one of" preceding a list of elements modifies the entire list of the elements and does not modify the individual elements of the list. For example, an expression, "at least one of a, b, and c" should be understood as including only a, only b, only c, both a and b, both a and c, both b and c, or all of a, b, and c.

Figure 1:
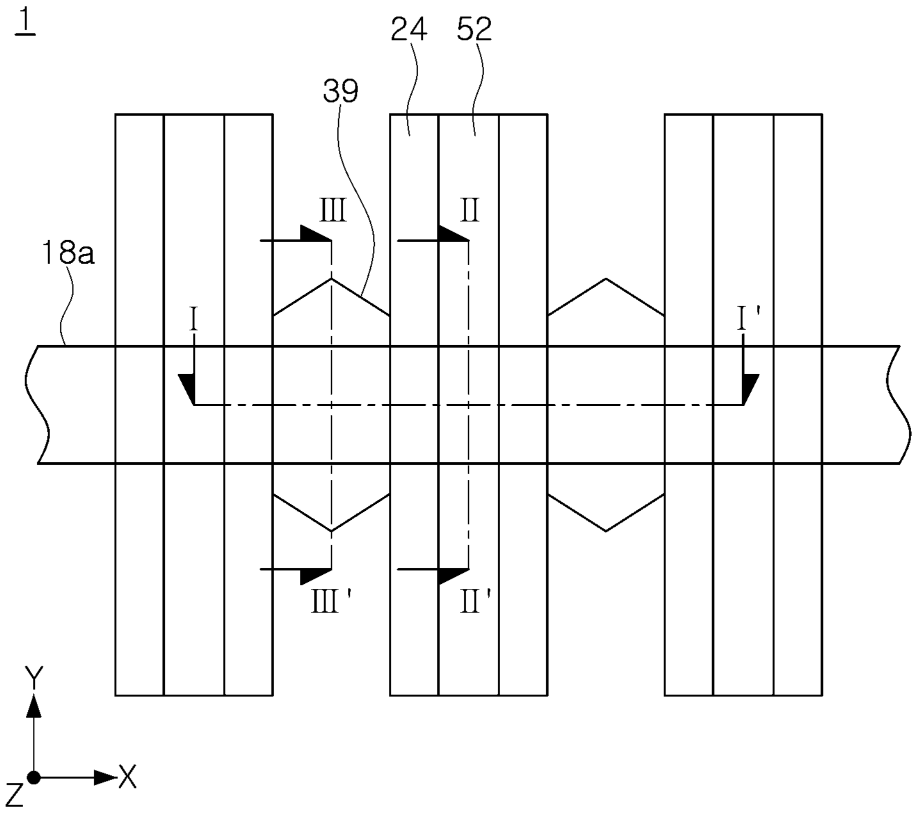
FIGS. 1 to 5 illustrate a semiconductor device, according to embodiments.
Figures 2A, 2B:
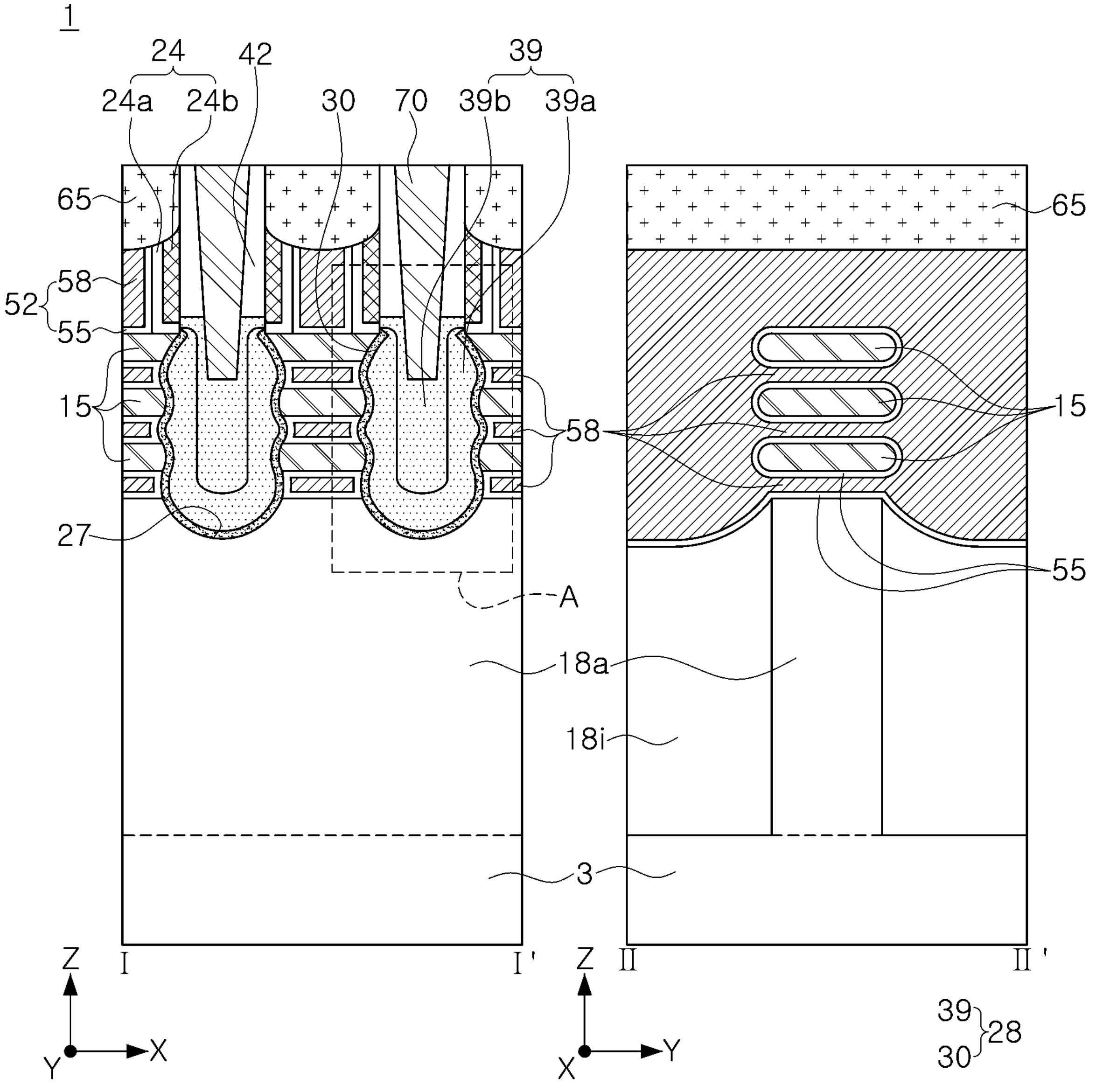
Figure 2C:
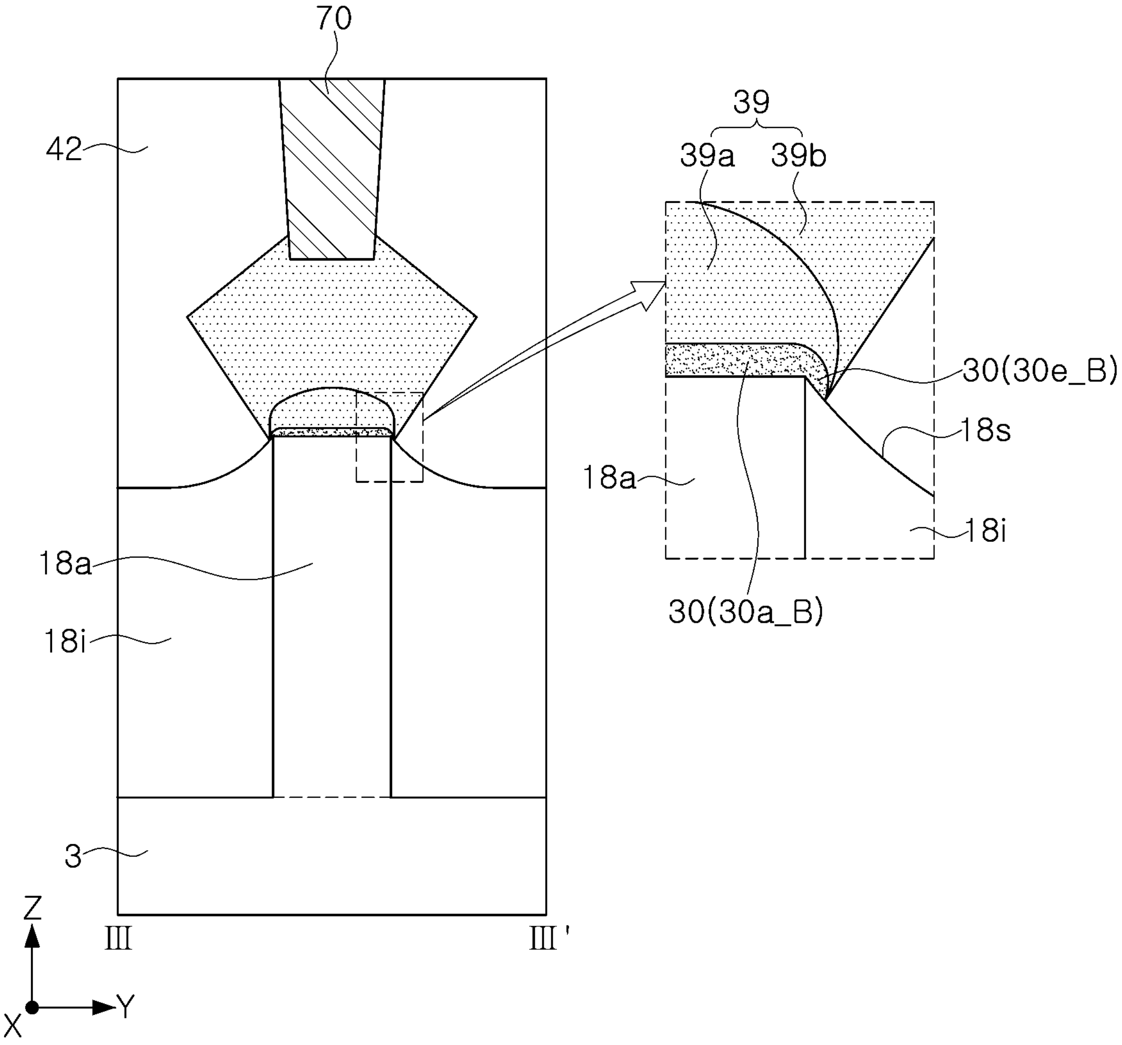
Figure 3:
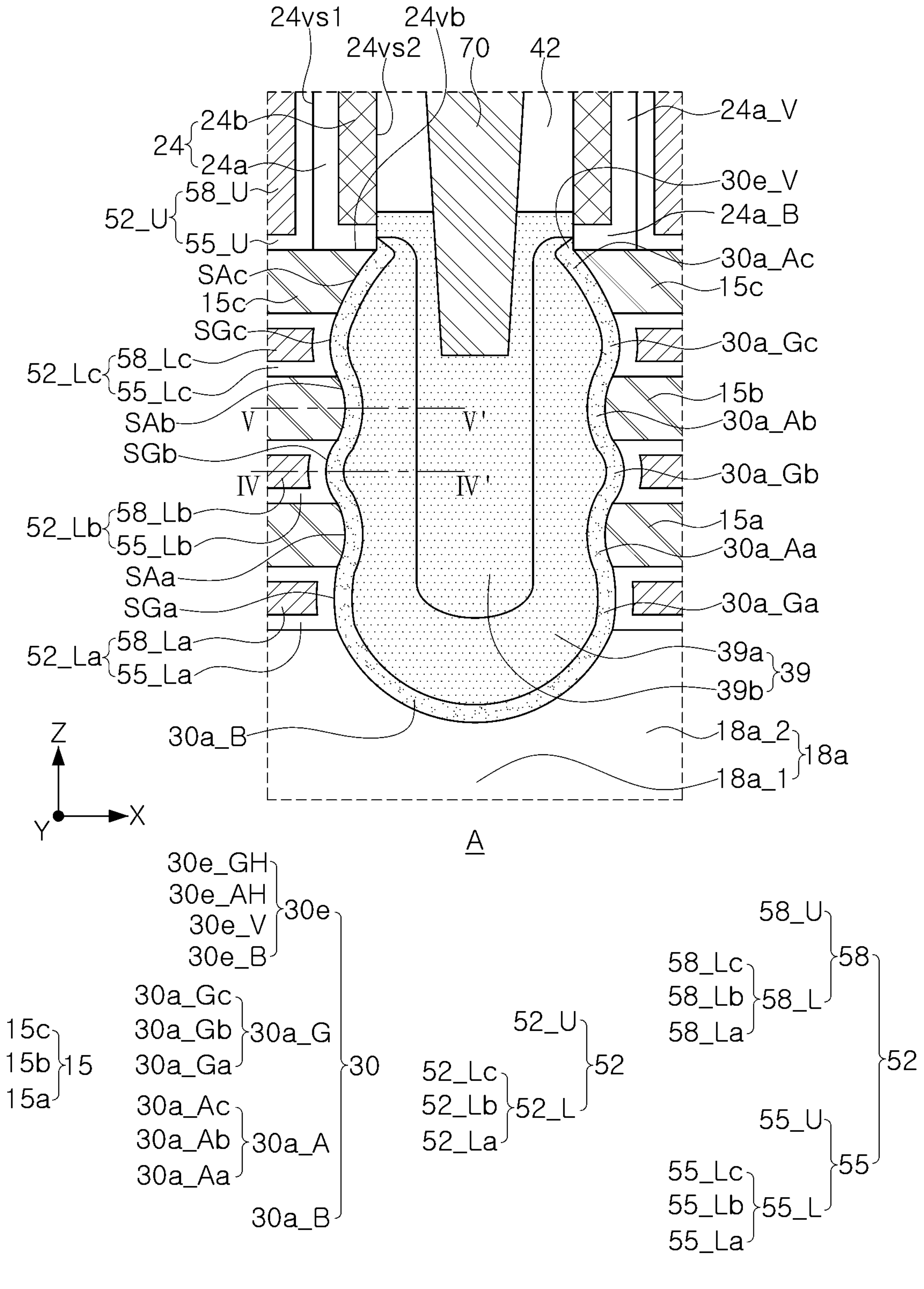
Figure 4:
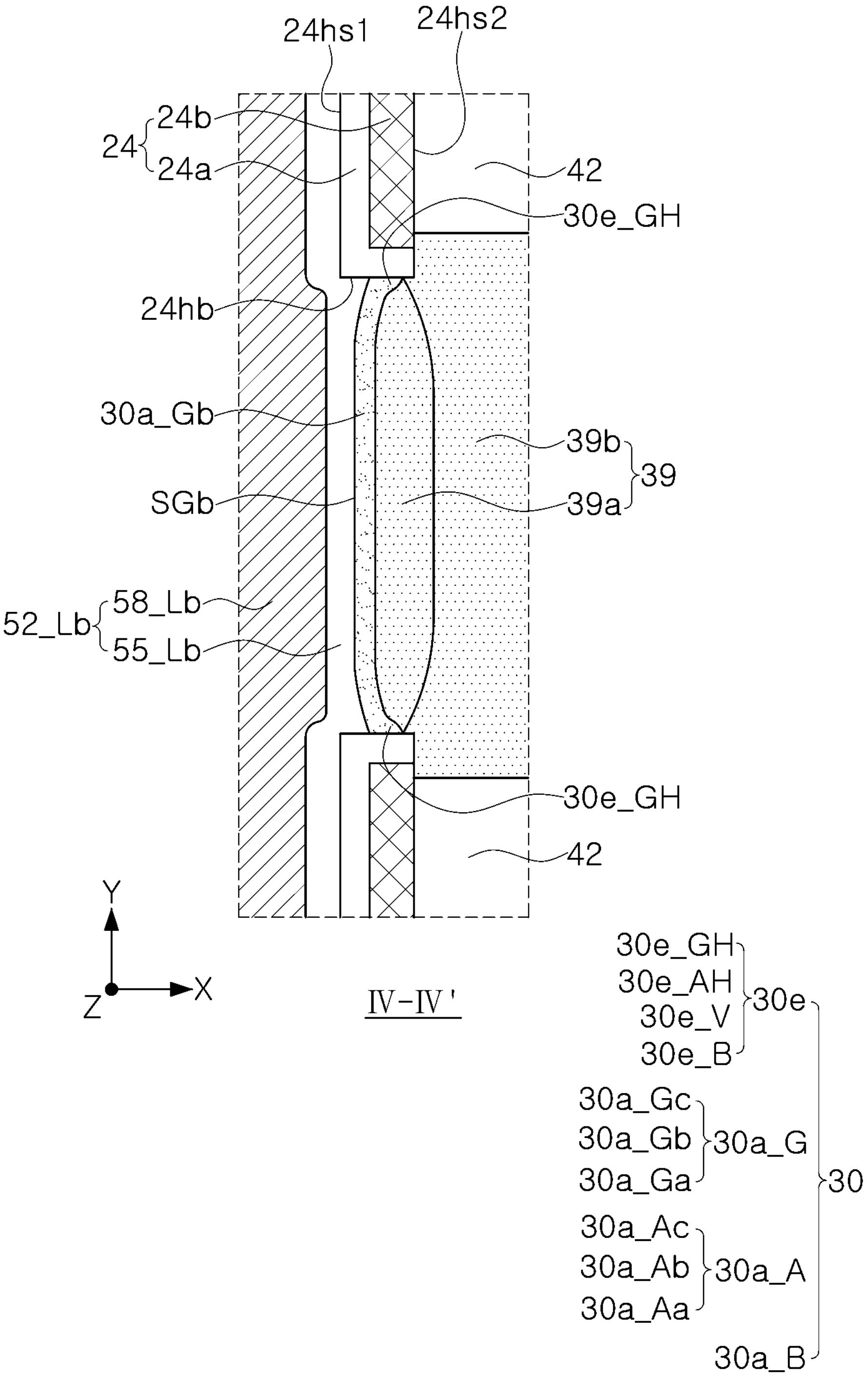
Figure 5:
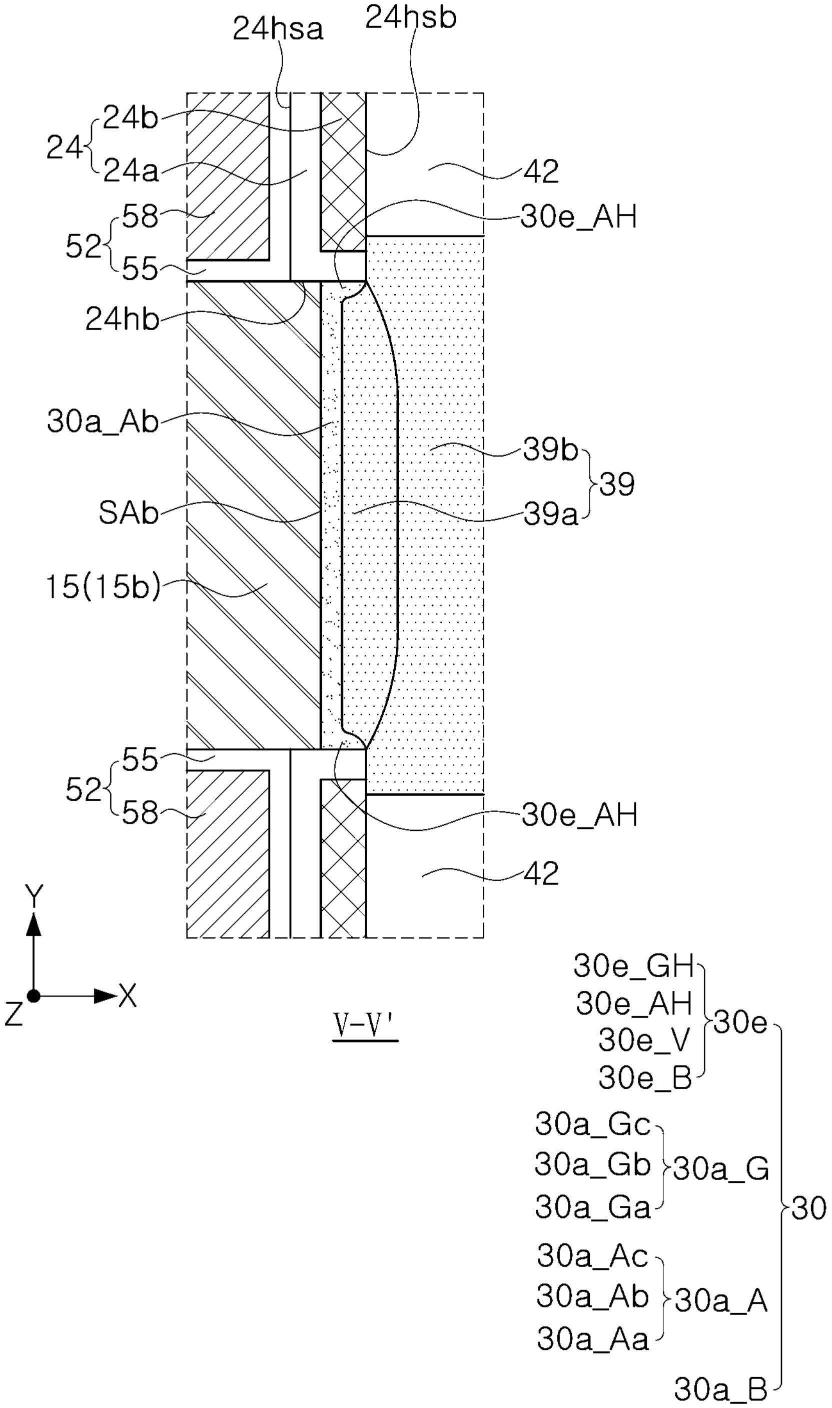

FIGS. 1 to 5 illustrate a semiconductor device, according to embodiments. FIG. 1 is a top plan view of a semiconductor device, according to an embodiment. FIG. 2A is a cross-sectional view of the semiconductor device shown in FIG. 1 taken along a line I-I', according to an embodiment. FIG. 2B is a cross-sectional view of the semiconductor device shown in FIG. 1 taken along a line according to an embodiment. FIG. 2C is a cross-sectional view of the semiconductor device shown in FIG. 1 taken along a line according to an embodiment. FIG. 3 is an enlarged view of a portion "A" shown in FIG. 2A, according to an embodiment. FIG. 4 is a plan view of the semiconductor device of FIG. 1 at a plane taken along a line IV-IV' in FIG. 3 in an X-Y horizontal direction. FIG. 5 is a plan view of the semiconductor device of FIG. 1 at a plane taken along a line V-V' in FIG. 3 in an X-Y horizontal direction.

It is understood here that FIG. 1 illustrates a structural and positional relationship between an active region, a gate structure, a gate spacer and a source/drain structure of a semiconductor device without showing all other structural elements of the semiconductor device for brevity purposes.

Referring to FIGS. 1, 2A-2B and 3, a semiconductor device 1 according to an embodiment may include a substrate 3, an active region 18*a* on the substrate 3, and an isolation region 18*i* disposed on a side surface of the active region 18*a* on the substrate 3.

The substrate 3 may include a semiconductor material, for example, a group IV semiconductor, a group III-V compound semiconductor, or a group II-VI compound semiconductor. For example, the group IV semiconductor may include silicon, germanium, or silicon-germanium. The substrate 3 may be provided as a bulk wafer, an epitaxial layer, a silicon on insulator (SOI) layer, or a semiconductor on insulator (SeOI) layer.

The isolation region 18*i* may be formed of an insulating material. For example, the isolation region 18*i* may include a low-κ dielectric, silicon oxide, silicon nitride, or another oxide or nitride compound, not being limited thereto. The isolation region 18*i* may be formed using a shallow trench isolation (STI) process.

The active region 18*a* may be an active fin extending from the substrate 3 in a vertical direction Z. The vertical direction Z may be a direction perpendicular to an upper surface of the substrate 3. The active region 18*a* may have a bar shape or a line shape extending in the first horizontal direction X, which is a channel-length direction, in the top plan view. The first horizontal direction X may be parallel to the upper surface of the substrate 3.

The active region 18*a* may include the same material as that of the substrate 3, for example, a semiconductor material. The active region 18*a* may include a well region. For example, when the active region 18*a* is to form a p-type metal-oxide-semiconductor (PMOS) transistor, the active region 18*a* may include an n-type well region including impurities such as phosphorus (P), arsenic (As) or antimony (Sb). Alternatively, when the active region 18*a* is to form an n-type metal-oxide-semiconductor (NMOS) transistor, the active region 18*a* may include a p-type well region including impurities such as boron (B), gallium (Ga) or indium (In). The active region 18*a* may include a first portion 18*a*_1 and a second portion 18*a*_2.

The semiconductor device 1 may further include a plurality of active layers 15 stacked and spaced apart from each other in the vertical direction Z above the second portion 18*a*_2 of the active region 18*a*. For example, the plurality of active layers 15 may include a lower active layer 15*a*, an intermediate active layer 15*b* on the lower active layer 15*a*, and an upper active layer 15*c* on the intermediate active layer 15*b*. FIGS. 2A-2B and 3 show that the plurality of active layers 15 include three active layers, the lower, intermediate, and upper active layers 15*a*, 15*b*, and 15*c*, but the disclosure is not limited thereto. For example, the plurality of active layers 15 may include more or less than three active layers spaced apart from each other in the vertical direction Z, according to embodiments.

The plurality of active layers 15 may include a semiconductor material which may be used as a channel region of a transistor, for example, a silicon material. For example, each of the plurality of active layers 15 may include a semiconductor layer, for example, a silicon layer. The plurality of active layers 15 may be referred to as channel layers.

The semiconductor device 1 may include a gate structure 52 extending in a second horizontal direction Y, which is a channel-width direction, while intersecting the active region 18*a* and surrounding the plurality of active layers 15, respectively, a gate capping pattern 65 on the gate structure 52, and a gate spacer 24 on the side surface of the gate structure 52. The gate structure 52 may intersect the active region 18*a* and may extend in the second horizontal direction Y. Accordingly, the gate structure 52 may include a portion vertically overlapping the active region 18*a* and a portion vertically overlapping the isolation region 18*i*.

The gate structure 52 may include a gate dielectric layer 55 and a gate electrode 58 on the gate dielectric layer 55. The gate dielectric layer 55 may include at least one of silicon oxide and a high-K dielectric. The high-K material may refer to a dielectric material having a dielectric constant higher than that of silicon oxide (e.g., $SiO_2$). The high-κ material may be one of, for example, aluminum oxide ($Al_2O_3$), tantalum oxide ($Ta_2O_3$), titanium oxide ($TiO_2$), yttrium oxide ($Y_2O_3$), zirconium oxide ($ZrO_2$), zirconium silicon oxide ($ZrSi_xO_y$), hafnium oxide ($HfO_2$), hafnium silicon oxide ($HfSi_xO_y$), lanthanum oxide ($La_2O_3$), lanthanum aluminum oxide ($LaAl_xO_y$), lanthanum hafnium oxide ($LaHf_xO_y$), hafnium aluminum oxide ($HfAl_xO_y$), and praseodymium oxide ($Pr_2O_3$).

The gate electrode 58 may include a conductive material. For example, the gate electrode 58 may include doped polysilicon, a metal, conductive metal nitride, a metal-semiconductor compound, conductive metal oxide, conductive graphene, conductive carbon nanotube, or a combination thereof. For example, the gate electrode 58 may be formed of doped polysilicon, Al, Cu, Ti, Ta, Ru, W, Mo, Pt, Ni, Co, TiN, TaN, WN, NbN, TiAl, TiAlN, TiSi, TiSiN, TaSi, TaSiN, RuTiN, NiSi, CoSi, $IrO_x$, $RuO_x$, conductive graphene, conductive carbon nanotube, or a combination thereof, but the disclosure is not limited thereto. The gate electrode 58 may include a single layer or multiple layers formed of the aforementioned materials.

The gate structure 52 may include lower gate portions 52_L disposed below each of the plurality of active layers 15 and an upper gate portion 52_U disposed above an uppermost active layer among the plurality of active layers 15. For example, in the gate structure 52, the lower gate portions 52_L may include a first lower gate portion 52_La between the active region 18*a* and the lower active layer 15*a*, a second lower gate portion 52_Lb between the lower active layer 15*a* and the intermediate active layer 15*b*, and a third lower gate portion 52_Lc between the intermediate active layer 15*b* and the upper active layer 15*c*.

In the cross-sectional structure taken along the first horizontal direction X, for example, the I-I' cross-sectional structure in FIG. 2A and the enlarged cross-sectional structure in FIG. 3, each of the lower gate portions 52_L of the gate structure 52 may include a lower gate electrode portion 58_L and a lower gate dielectric portion 55_L surrounding the lower gate electrode portion 58_L, and the upper gate portion 52_U of the gate structure 52 may include an upper gate electrode portion 58_U and an upper gate dielectric portion 55_U disposed on the lower surface and side surfaces of the upper gate electrode portion 58_U. For example, the lower gate portion 58_L may include lower gate electrode portions 58_La, 58_Lb, and 58_Lc, and the lower gate dielectric portion 55_L may include lower gate dielectric portions 55_La, 55_Lb, and 55_Lc surrounding a lower surface, an upper surface and side surfaces of the lower gate electrode portions 58_La, 58_Lb, and 58_Lc, respectively.

The gate spacer 24 may be formed of an insulating material. For example, the gate spacer 24 may include a low-ic dielectric, silicon oxide, silicon nitride, silicon oxynitride (SiON), or a combination thereof, not being limited thereto. For example, the gate spacer 24 may include multiple layers formed of the materials described above. For example, the gate spacer 24 may include a first spacer 24*a* and a second spacer 24*b*. The first spacer 24*a* may include a first material, the second spacer 24*b* may include a second material different from the first material. For example, the first material of the first spacer 24*a* may include at least one of a low-ic dielectric and silicon oxide, the second material of the second spacer 24*b* may include at least one of silicon nitride and silicon oxynitride (SiON). The first spacer 24*a* may include a vertical portion 24*a* V interposed between the upper gate portion 52_U and the second spacer 24*b* in the first horizontal direction X, and a lower portion 24*a* B interposed between the second spacer 24*b* and the upper active layer 15*c* in the vertical direction Z. Herein, the lower portion 24*a* B may also be referred to as a horizontal portion.

The gate capping pattern 65 may be disposed on the gate structure 52 and the gate spacer 24. The gate capping pattern 65 may include an insulating material such as silicon nitride, not being limited thereto.

The semiconductor device 1 may further include epitaxial structures 28, an interlayer insulating layer 42, and a contact plug 70. The epitaxial structures 28 may include portions disposed above the first portion 18*a*_1 of the active region 18*a*, connected to the plurality of active layers 15, and overlapping the isolation region 18*i* in the vertical direction Z. For example, the epitaxial structures 28 may partially overlap the isolation region 18*i* in the vertical direction Z. The epitaxial structures 28 may be electrically connected to the plurality of active layers 15. The interlayer insulating layer 42 may be disposed on side surfaces of the gate spacer 24, the gate capping pattern 65 and the upper gate portion 52U. The interlayer insulating layer 42 may be disposed above the epitaxial structures 28. The interlayer insulating layer 42 may be disposed above the isolation region 18*i*. The contact plug 70 may penetrate through the interlayer insulating layer 42 and may be electrically connected to the epitaxial structures 28. The contact plug 70 may be formed of a conductive material.

The epitaxial structures 28 may include a blocking layer 30 and a source/drain structure 39 on the blocking layer 30.

The source/drain structure 39 may include a first source/drain epitaxial layer 39*a* and a second source/drain epitaxial layer 39*b* on the first source/drain epitaxial layer 39*a*. The first source/drain epitaxial layer 39*a* may include a first SiGe material, and the second source/drain epitaxial layer 39*b* may include a second SiGe material having a composition different from that of the first SiGe material. For example, the Ge concentration of the second SiGe material may be higher than the Ge concentration of the first SiGe material.

The source/drain structure 39 may be a source/drain region of a transistor. For example, in a PMOS transistor, the source/drain structure 39 may have p-type conductivity by including impurities such as boron (B).

The contact plug 70 may contact and electrically connected to the second source/drain epitaxial layer 39*b*.

The blocking layer 30 may include an epitaxial layer. The blocking layer 30 may have a material composition different from the source/drain structure 39. According to an embodiment, the blocking layer 30 may be configured as a silicon epitaxial layer. The blocking layer 30 may be a single crystal silicon layer. The blocking layer 30 may include a material having a composition different from that of the source/drain structure 39. For example, the source/drain structure 39 may include a SiGe epitaxial layer, and the blocking layer 30 may include an epitaxial layer different from the SiGe epitaxial layer, for example, a silicon epitaxial layer. According to an embodiment, when the source/drain structure 39 is formed of silicon (Si) or SiGe and doped with one or more impurities such as P, As, Sb, B, Ga, In, etc., the blocking layer may be formed of Si without one or more of the impurities.

In an example, the blocking layer 30 may include a doped epitaxial layer, for example, a doped silicon layer.

The blocking layer 30 may include a doped epitaxial layer doped with at least one of carbon (C), oxygen (O), nitrogen (N), or fluorine (F), for example, a doped silicon layer doped with at least one of carbon (C), oxygen (O), nitrogen (N), and fluorine (F).

The blocking layer 30 may include a doped epitaxial layer, for example, a doped silicon layer, including impurities doped by diffusion of impurities in the source/drain region of the transistor, for example, the source/drain structure 39. For example, a maximum concentration of impurities in the doped silicon layer of the blocking layer 30 may be lower than a maximum concentration of impurities in the source/drain region of a transistor, for example, the source/drain structure 39. For example, when the source/drain structure 39 adjacent to the blocking layer 30 is doped with boron, the blocking layer 30 may also be doped with boron, and a maximum concentration of boron in the blocking layer 30 may be lower than a maximum concentration of boron in the source/drain structure 39.

The blocking layer 30 may include a doped silicon layer including at least one of C, O, N, F and B (boron).

As another example, at least a portion of the blocking layer 30 may include an undoped epitaxial layer, for example, an undoped silicon layer. For example, the blocking layer 30 may be doped with the same impurities as impurities in the source/drain structure 39 in a portion adjacent to the source/drain structure 39, and may not be doped with the impurities in a portion spaced apart or distant from the source/drain structure 39.

The blocking layer 30 may have a thickness ranging from about 1 nm to about 5 nm. For example, to prevent a leakage current between the source/drain structure 39 and the gate electrode 58, the blocking layer 30 may have a thickness of about 1 nm or more, and the blocking layer 30 may have a thickness of about 5 nm or less to prevent electrical properties of the semiconductor device 1 from deteriorating as a size of the source/drain structure 39, for example, volume, decreases.

The first source/drain epitaxial layer 39*a* of the source/drain structure 39 may be disposed between the blocking layer 30 and the second source/drain epitaxial layer 39*b*. The first source/drain epitaxial layer 39*a* may have a thickness greater than that of the blocking layer 30.

In the enlarged cross-sectional view of FIG. 3, the gate spacer 24 may include a lower surface 24*vb*, an internal side surface 24*vs*1, and an external side surface 24*vs*2. The lower surface 24*vb* of the gate spacer 24 may contact the upper surface of the upper active layer 15*c*, and the internal side surface 24*vs*1 of the gate spacer 24 may contact the upper gate dielectric portion 55U of the upper gate portion 52_U, and the external side surface 24*vs* of the gate spacer 24 may be opposite to the internal side surface 24*vs*1 of the gate spacer 24 in the first horizontal direction X.

The blocking layer 30 may include a plurality of active blocking portions 30*a*_A contacting the plurality of active layers 15, a lower blocking portion 30*a*_B contacting the active region 18*a*, and a plurality of gate blocking portions 30*a*_G contacting the lower gate portions 52_L.

The blocking layer 30 may further include at least one bent portion 30*e* bent and extending from at least one of the plurality of active blocking portions 30*a*_A, the plurality of gate blocking portions 30*a*_G, and the lower blocking portion 30*a*_B, and contacting the gate spacer 24.

In the blocking layer 30, the plurality of active blocking portions 30*a*_A, the plurality of gate blocking portions 32*a*_G, the lower blocking portion 30*a*_B, and the at least one bent portion 30*e* may be integrated with each other. In the blocking layer 30, the plurality of active blocking portions 30*a*_A, the plurality of gate blocking portions 32*a*_G, the lower blocking portion 30*a*_B, and the at least one bent portion 30*e* may be formed as a continuously connected and integrated single layer or structure.

The plurality of active blocking portions 30*a*_A may include a lower active blocking portion 30*a*_Aa, an intermediate active blocking portion 30*a*_Ab on the lower active blocking portion 30*a*_Aa, and an upper active blocking portion 30*a*_Ac on the intermediate active blocking portion 30*a*_Ab. The lower active blocking portion 30*a*_Aa may be disposed at the same or substantially the same level as a level of the lower active layer 15*a* and may contact the lower active layer 15*a*. The intermediate active blocking portion 30*a*_Ab may be disposed at the same or substantially the same level as a level of the intermediate active layer 15*b* and may contact the intermediate active layer 15*b*. The upper active blocking portion 30*a*_Ac may be disposed at the same or substantially the same level as a level of the upper active layer 15*c* and may contact the upper active layer 15*c*.

The plurality of gate blocking portions 30*a*_G may include a lower gate blocking portion 30*a*_Ga, an intermediate gate blocking portion 30*a*_Gb on the lower gate blocking portion 30*a*_Ga, and an upper gate blocking portion 30*a*_Gc on the intermediate gate blocking portion 30*a*_Gb. The lower gate blocking portion 30*a*_Ga may be disposed at the same or substantially the same level as a level of the first lower gate portion 52_La and may contact the lower gate dielectric portion 55_La of the first lower gate portion 52_La. The intermediate gate blocking portion 30*a*_Gb may be disposed at the same or substantially the same level as a level of the second lower gate portion 52_Lb and may contact the lower gate dielectric portion 55_Lb of the second lower gate portion 52_Lb. The upper gate blocking portion 30*a*_Gc may be disposed at the same or substantially the same level as a level of the third lower gate portion 52_Lc and may contact the lower gate dielectric portion 55_Lc of the third lower gate portion 52_Lc.

In the cross-sectional structure illustrated in FIG. 3, at least a portion of the plurality of active blocking portions 30*a*_A may be bent in a direction toward a vertical central axis of the source/drain structure 39, and a portion of the plurality of gate blocking portions 30*a*_G may be bent in a direction away from a vertical central axis of the source/drain structure 39.

The at least one bent portion 30*e* of the blocking layer 30 may include at least one first bent portion extending from at least one of the plurality of active blocking portions 30*a*_A. For example, in the cross-sectional structure illustrated in FIG. 3, the at least one bent portion 30*e* of the blocking layer 30 may include a vertical bent portion 30*e*_V bent and extending from the upper active blocking portion 30*a*_Ac among the plurality of active blocking portions 30*a*_A and contacting the external side surface 24*vs*2 of the gate spacer 24. The vertical bent portion 30*e*_V may contact a side surface of the first spacer 24*a* of the gate spacer 24 and may be spaced apart from the second spacer 24*b*.

In the cross-sectional structure illustrated in FIG. 3, the vertical bent portion (30*e*_V in FIG. 3) may contact at least a half of the side surface of the first spacer 24*a* in the external side surface 24*vs*2 of the gate spacer 24, and may be spaced apart from the side surface of the second spacer 24*b*.

In the cross-sectional structure illustrated in FIG. 3, the side surface of the first spacer 24*a* in the external side surface 24*vs*2 of the gate spacer 24 may contact the second source/drain epitaxial layer 39*b* and the vertical bent portion 30*e*_V of the source/drain structure 39. In the cross-sectional structure illustrated in FIG. 3, the second source/drain epitaxial layer 39*b* of the source/drain structure 39 may contact a portion of the side surface of the first spacer 24*a* and a portion of the side surface of the second spacer 24*b* in the external side surface 24*vs*2 of the gate spacer 24.

In the cross-sectional structure illustrated in FIG. 3, a lower surface of the contact plug 70 may be disposed on a level lower than a level of the vertical bent portion 30*e*_V. In the cross-sectional structure illustrated in FIG. 3, the lower surface of the contact plug 70 may be disposed on a level lower than a level of the upper active layer 15*c*.

In the cross-sectional structure illustrated in FIG. 2C, the at least one bent portion 30*e* of the blocking layer 30 may further include a lower bent portion 30*e*_B bent and extending from the lower blocking portion 30*a*_B and contacting the upper surface 18*s* of the isolation region 18*i*. A level of a portion of the upper surface 18*s* of the isolation region 18*i* may be lowered in a direction away from the side surface of the active region 18*a*. A lower end portion (e.g., the lowermost end portion) of the lower bent portion 30*e*_B may be disposed on a level lower than a level of the lower blocking portion 30*a*_B.

An end portion of the at least one bent portion 30*e* of the blocking layer 30 may have a pointed shape.

The at least one bent portion 30*e* of the blocking layer 30 may prevent a leakage current that may be generated between the gate electrode 58 and the source/drain structure 39, or may prevent an electrical short that may be generated between the gate electrode 58 and the source/drain structure 39. For example, the at least one bent portion 30*e* (e.g., the vertical vent portion 30*e*_V) of the blocking layer 30 may prevent a leakage current or electrical short that may be generated along the lower surface of the gate spacer 24 between the upper gate electrode portion 58_U and the source/drain structure 39.

In the description below, a top plan view illustrating one of the lower gate portions 52_L, for example, the second lower gate portion 52_Lb among the lower gate portions 52_L will be described with reference to FIG. 4.

Referring to FIG. 4 together with FIGS. 1 to 3, in the top plan view, the gate spacer 24 may have a first side surface 24*hsa* contacting the gate dielectric layer 55, a second side surface 24*hsb* opposite to the first side surface 24*hsa*, and a third side surface 24*hb* extending from the end portions of the first and second side surfaces 24*hsa* and 24*hsb*, connecting the end portion to each other, and contacting the blocking layer 30. In the gate spacer 24, the first and second side surfaces 24*hsa* and 24*hsb* may be side surfaces disposed in the first horizontal direction X, and the third side surface 24*hb* may be a side surface disposed in the second horizontal direction Y.

The lower gate blocking portion 30*a*_Ga may have a side surface SGa (in FIG. 3) contacting the lower gate dielectric portion 55_La of the first lower gate portion 52_La, the intermediate gate blocking portion 30*a*_Gb may have a side surface SGb (in FIGS. 3 and 4) contacting the lower gate dielectric portion 55_Lb of the second lower gate portion 52_Lb, and the upper gate blocking portion 30*a*_Gc may have a side surface SGc (in FIG. 3) contacting the lower gate dielectric portion 55_Lc of the third lower gate portion 52_Lc.

The at least one bent portion 30*e* may further include at least one first horizontal bent portion 30*e*_GH bent and extending (e.g., bent and extending horizontally) from at least one of the gate blocking portions 30*a*_G. For example, the at least one first horizontal bent portion 30*e*_GH may include a first lower horizontal bent portion bent and extending from the lower gate blocking portion 30*a*_Ga, a first intermediate horizontal bent portion bent and extending from the intermediate gate blocking portion 30*a*_Gb, and a first upper horizontal bent portion bent and extending from the upper gate blocking portion 30*a*_Gc.

In the at least one first horizontal bent portion 30*e*_GH, the first lower horizontal bent portion and the first upper horizontal bent portion may have substantially the same planar shape as that of the first intermediate horizontal bent portion, and thus, the first intermediate horizontal bent portion will be described.

The first side surface 24*hsa* of the gate spacer 24 may contact the gate dielectric layer 55, for example, at least the lower gate dielectric portion 55_Lb of the second lower gate portion 52_Lb (in FIG. 4).

The first intermediate horizontal bent portion of the at least one first horizontal bent portion 30*e*_GH may be bent and extending from an end portion of the intermediate gate blocking portion 30*a*_Gb, may contact the third side surface 24*hb* of the gate spacer 24 and may be spaced apart from the second side surface 24*hsb* of the gate spacer 24. The first intermediate horizontal bent portion of the at least one first horizontal bent portion 30*e*_GH may not contact the second side surface 24*hsb* of the gate spacer 24.

The third side surface 24*hb* of the gate spacer 24 may contact the lower gate dielectric portion 55_Lb of the second lower gate portion 52_Lb, the intermediate gate blocking portion 30*a*_Gb, and the at least one first horizontal bent portion 30*e*_GH (e.g., the first intermediate horizontal bent portion).

The first intermediate horizontal bent portion of the at least one first horizontal bent portion 30*e*_GH may increase a distance between the lower gate electrode portion 58_Lb of the second lower gate portion 52_Lb and the source/drain structure 39 in the third side surface 24*hb* of the gate spacer 24. Accordingly, the first intermediate horizontal bent portion of the at least one first horizontal bent portion 30*e*_GH may prevent a leakage current between the lower gate electrode portion 58_Lb of the second lower gate portion 52_Lb and the source/drain structure 39, that may be generated on the third side surface 24*hb* of the gate spacer 24, or electrical short between the lower gate electrode portion 58_Lb of the second lower gate portion 52_Lb and the source/drain structure 39, that may be generated on the third side surface 24*hb* of the gate spacer 24.

According to an embodiment, the at least one first horizontal bent portion 30*e*_GH may prevent a leakage current between the lower gate electrode portions 58_La, 58_Lb, and 58_Lc of the lower gate portions 52_L and the source/drain structure 39, that may be generated on the third side surface 24*hb* of the gate spacer 24, or electrical short between the lower gate electrode portions 58_La, 58_Lb, and 58_Lc of the lower gate portions 52_L and the source/drain structure 39, that may be generated on the third side surface 24*hb* of the gate spacer 24.

The second source/drain epitaxial layer 39*b* of the source/drain structure 39 may contact a portion of the third side surface 24*hb* of the gate spacer 24, and may contact a portion of the second side surface 24*hsb* of the gate spacer 24.

In the description below, a top plan view illustrating one active layer of the plurality of active layers 15, for example, the intermediate active layer 15*b* among the plurality of active layers 15, will be described with reference to FIG. 5.

Referring to FIG. 5 together with FIGS. 1 to 4, as described with reference to FIG. 4, in the top plan view, the gate spacer 24 may include the first side surface 24*hsa*, the second side surface 24*hsb*, and the third side surface 24*hb*.

The lower active blocking portion 30*a*_Aa may have a side surface (SAa in FIG. 3) contacting the lower active layer 15*a*, the intermediate active blocking portion 30*a*_Ab may have a side surface SAb (in FIGS. 3 and 5) contacting the intermediate active layer 15*b*, and the upper active blocking portion 30*a*_Ac may have a side surface SAc (in FIG. 3) contacting the upper active layer 15*c*.

The at least one bent portion 30*e* may include at least one second horizontal bent portion 30*e*_AH bent and extending (e.g., bent and extending horizontally) from at least one of the active blocking portions 30*a*_A. For example, the at least one second horizontal bent portion 30*e*_AH may include a second lower horizontal bent portion bent and extending from the lower active blocking portion 30*a*_Aa, a second intermediate horizontal bent portion bent and extending from the intermediate active blocking portion 30*a*_Ab, and a second upper horizontal bent portion bent and extending from the upper active blocking portion 30*a*_Ac.

In the at least one second horizontal bent portion 30*e*_AH, the second lower horizontal bent portion and the second upper horizontal bent portion may have substantially the same planar shape as that of the second intermediate horizontal bent portion, and thus, the second intermediate horizontal bent portion will be mainly described.

In the plan view of FIG. 5, the second intermediate horizontal bent portion of the at least one second horizontal bent portion 30*e*_AH may be bent and extend from an end portion of the intermediate active blocking portion 30*a*_Ab, may contact the third side surface 24*hb* of the gate spacer 24 and may be spaced apart from the second side surface 24*hsb* of the gate spacer 24. The second intermediate horizontal bent portion of the at least one second horizontal bent portion 30*e*_AH may not contact the second side surface 24*hsb* of the gate spacer 24. In the plan view, the at least one second horizontal bent portion 30*e*_AH may extend from the at least one of the active blocking portions 30*a*_A, may be bent from the at least one of the active blocking portions 30*a*_A in a direction away from the intermediate active layer 15*b*, and may contact the gate spacer 24. In the plan views of FIGS. 4 and 5, the at least one bent portion 30*e*_AH or 30*e*_GH may extend from the at least one of the active blocking portions 30*a*_A and the plurality of gate blocking portions 30*a*_G, may be bent in a direction away from the first side surface 24*hs*1 or 24*hsa* toward the second side surface 24*hs*2 or 24*hs*b, and may contact the third side surface 24*hb* of the gate spacer 24.

The third side surface 24*hb* of the gate spacer 24 may contact the intermediate active layer 15*b*, the intermediate active blocking portion 30*a*_Ab, and the at least one second horizontal bent portion 30*e*_AH (e.g., the second intermediate horizontal bent portion).

The second intermediate horizontal bent portion of the at least one second horizontal bent portion 30*e*_AH may increase a distance between the gate electrode 58 and the source/drain structure 39 on the third side surface 24*hb* of the gate spacer 24.

Accordingly, the at least one second horizontal bent portion 30*e*_AH may prevent a leakage current between the gate electrode 58 and the source/drain structure 39, that may be generated on the third side surface 24*hb* of the gate spacer 24, and electrical short between the gate electrode 58 and the source/drain structure 39, that may be generated on the third side surface 24*hb* of the gate spacer 24.

The second source/drain epitaxial layer 39*b* of the source/drain structure 39 may contact a portion of the second side surface 24*hsb* of the gate spacer 24. The second spacer 24*b* may be spaced apart from the at least one second horizontal bent portion 30*e*_AH. For example, the second spacer 24*b* may not contact the at least one second horizontal bent portion 30*e*_AH.

Hereinafter, various modified examples of components of the above-described semiconductor device 1 will be described. The various modified examples of the components of the above-described semiconductor device 1 will be described below based on the modified or replaced components. Also, components which may be modified or replaced will described below with reference to the drawings, but the components which may be modified or replaced may be combined with each other, or may be combined with other components described above and may be included in the semiconductor device 1 according to embodiment.

Figure 6:
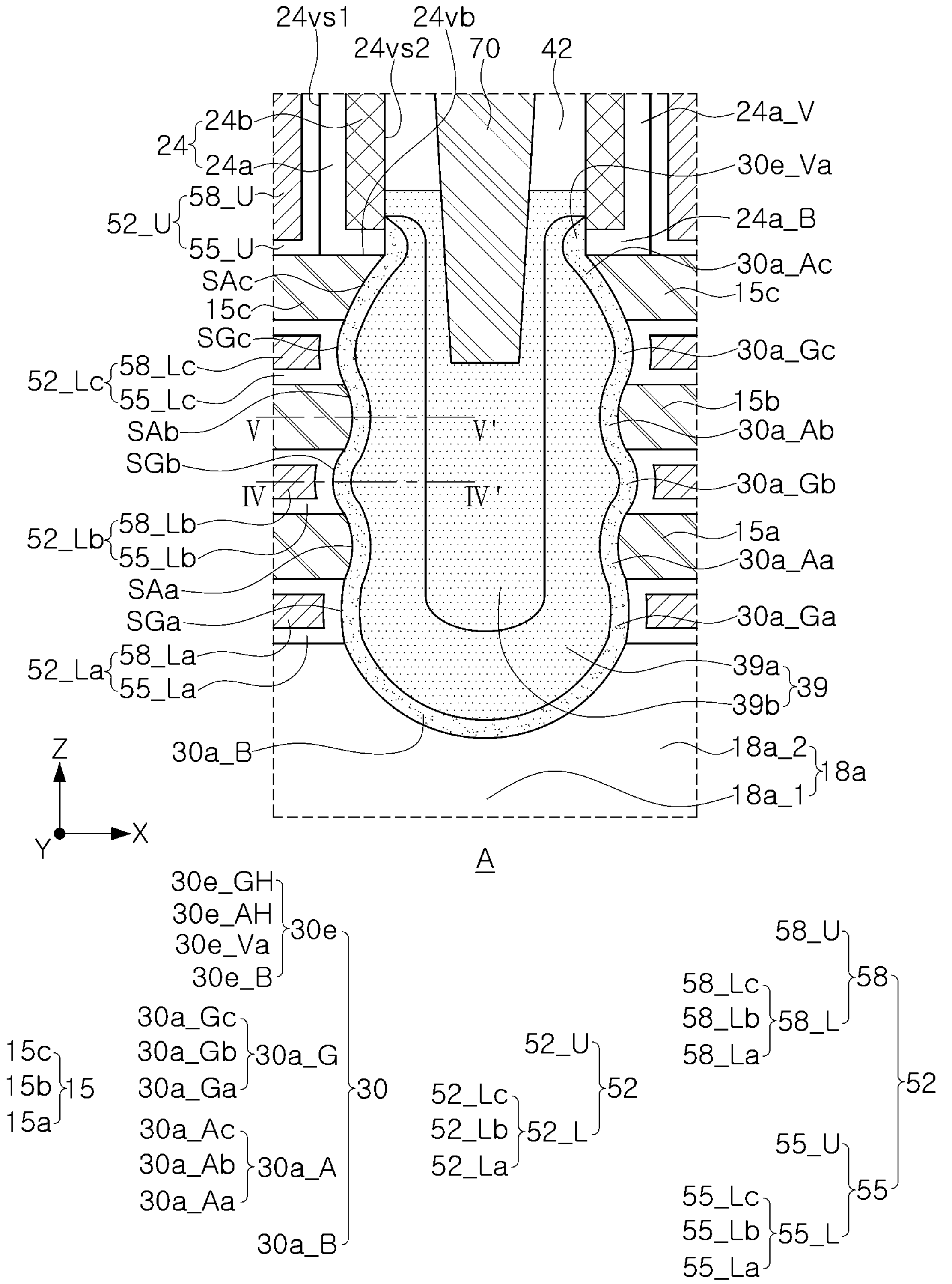
FIG. 6 is an enlarged cross-sectional diagram illustrating a modified example of the semiconductor device of FIG. 1, according to an embodiment.
Figure 7:
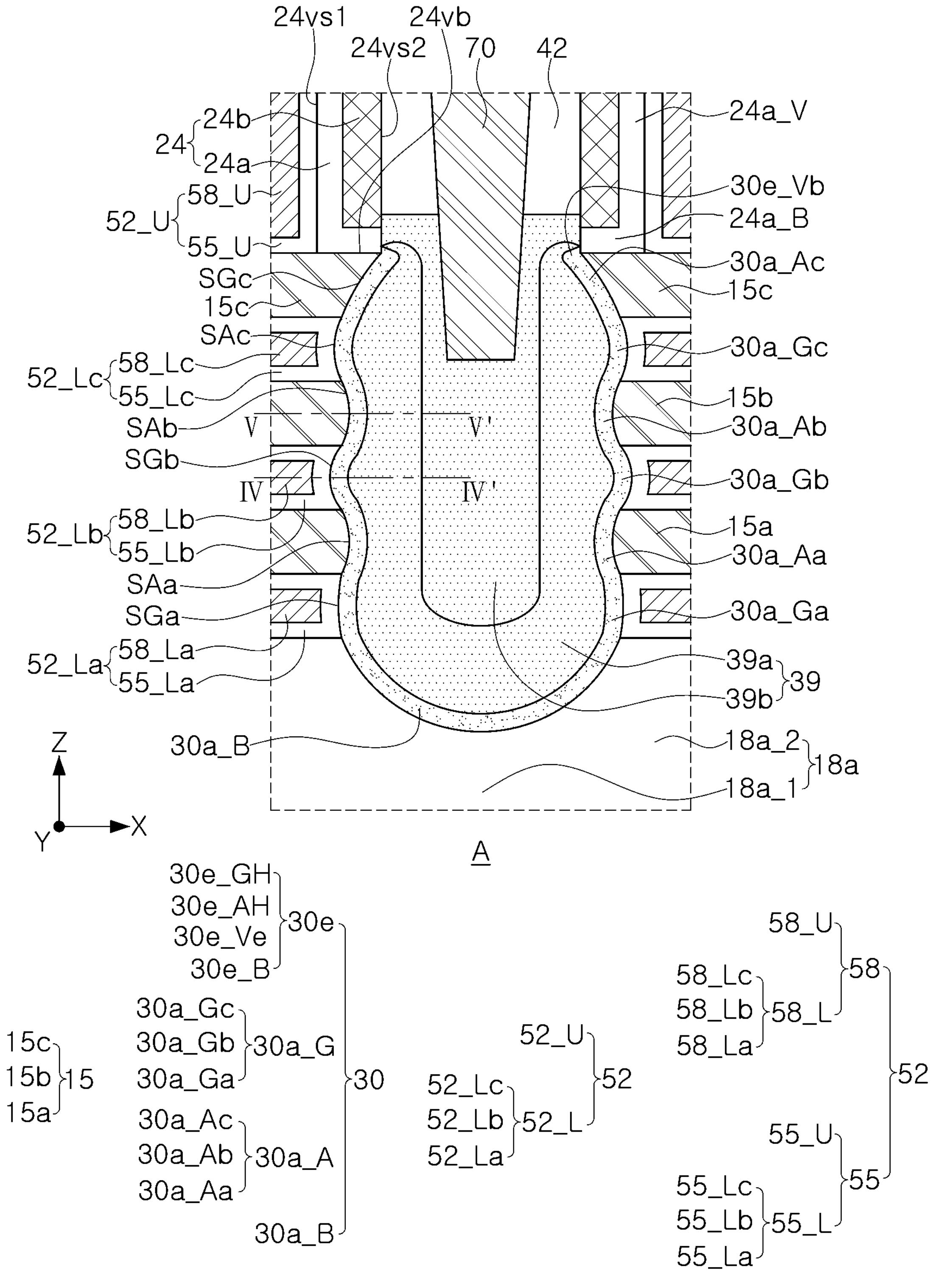
FIG. 7 is an enlarged cross-sectional viws illustrating the modified example of the semiconductor device of FIG. 1, according to an embodiment.

Various modified examples of the vertical bent portion 30*e*_V shown in FIG. 3 will be described with reference to FIGS. 6 and 7. FIG. 6 is an enlarged cross-sectional diagram illustrating a modified example of the semiconductor device of FIG. 1, according to an embodiment, and FIG. 7 is an enlarged cross-sectional view illustrating the modified example of the semiconductor device of FIG. 1, according to an embodiment. FIG. 6 is a cross-sectional view illustrating a modified component from the cross-sectional structure in FIG. 3, and FIG. 7 is a cross-sectional view illustrating a modified component from the cross-sectional structure in FIG. 3.

In a modified example, referring to FIG. 6, in the external side surface 24*vs*2 of the gate spacer 24 described with reference to FIG. 3, the vertical bent portion 30*e*_V (in FIG. 3) contacting a portion of the side surface of the first spacer 24*a* and spaced apart from the side surface of the second spacer 24*b* may be modified to a vertical bent portion 30*e*_Va bent and extending from the upper active blocking portion 30*a*_Ac, contacting the side surface of the first spacer 24*a* and a portion of the side surface of the second spacer 24*b* in the external side surfaces 24*vs*2 of the gate spacer 24.

In another modified example, referring to FIG. 7, the vertical bent portion 30*e*_V (in FIG. 3) contacting at least a half of the side surface of the first spacer 24*a* in the external side surface 24*vs*2 of the gate spacer 24 and spaced apart from the side surface of the second spacer 24*b* may be modified to a vertical bent portion 30*e*_Vb bent and extending from the upper active blocking portion 30*a*_Ac and contacting less than a half of the side surface of the first spacer 24*a* in the external side surface 24*vs*2 of the gate spacer 24.

Figure 8:
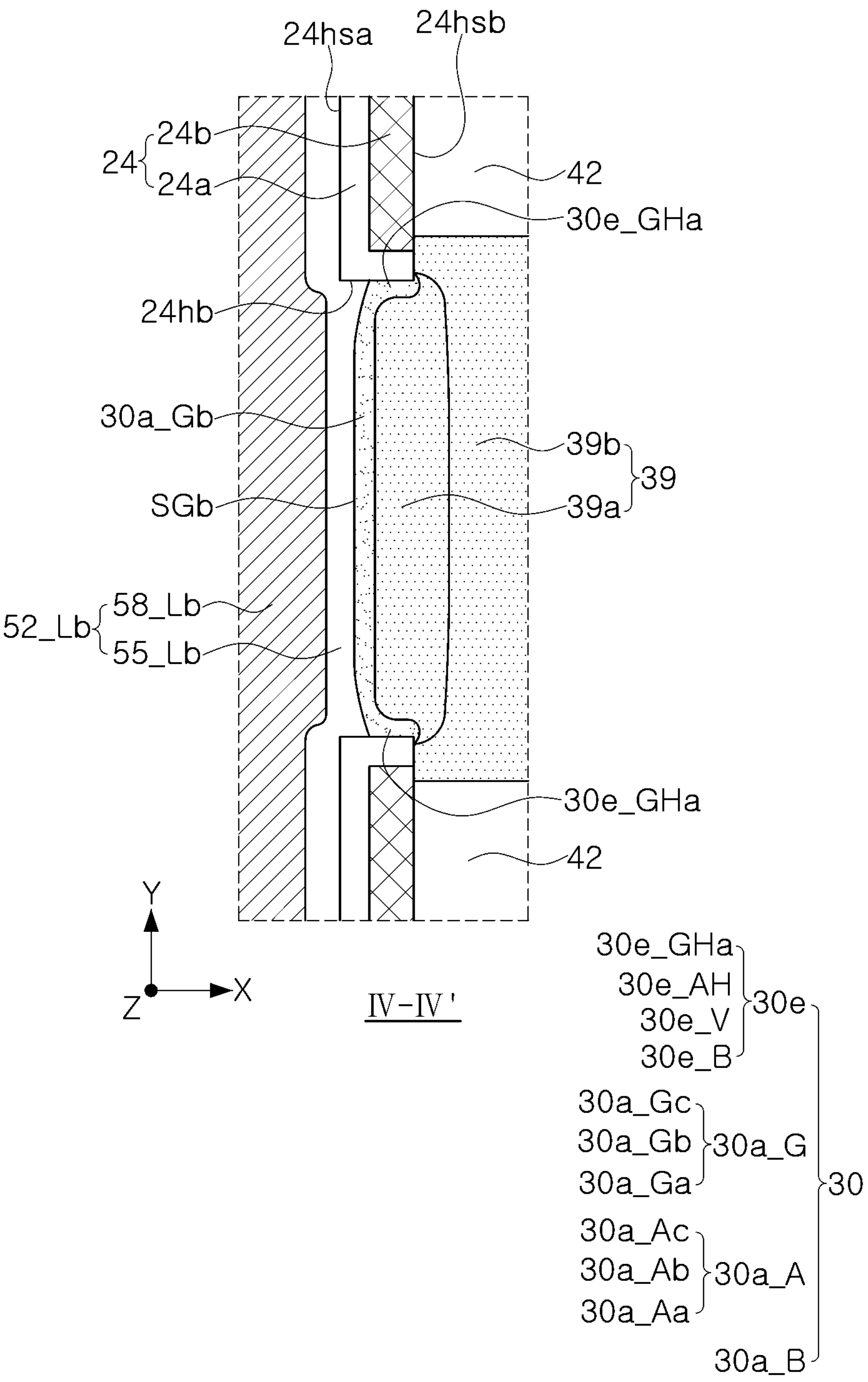
FIG. 8 is an enlarged cross-sectional view of a modified example of the semiconductor device of FIG. 1 in a plan view, illustrating a modified component of FIG. 4, according to an embodiment.

In the description below, a modified example of the first horizontal bent portion 30*e*_GH shown in FIG. 4 will be described with reference to FIG. 8. FIG. 8 is an enlarged cross-sectional view of a modified example of the semiconductor device of FIG. 1 in a plan view, illustrating a modified component of FIG. 4, according to an embodiment.

In a modified example, referring to FIG. 8, the at least one first horizontal bent portion 30*e*_GH (in FIG. 4) contacting the third side surface 24*hb* of the gate spacer 24 and spaced apart from the second side surface 24*hsb* of the gate spacer 24 may be modified to a first horizontal bent portion 30*e*_GHa extending from a portion contacting the third side surface 24*hb* of the gate spacer 24 and disposed on a portion of the second side surface 24*hsb* of the gate spacer 24. The first horizontal bent portion 30*e*_GHa may be spaced apart from the second spacer 24*b*. For example, the first horizontal bent portion 30*e*_GHa may not contact the second spacer 24*b*.

Figure 9:
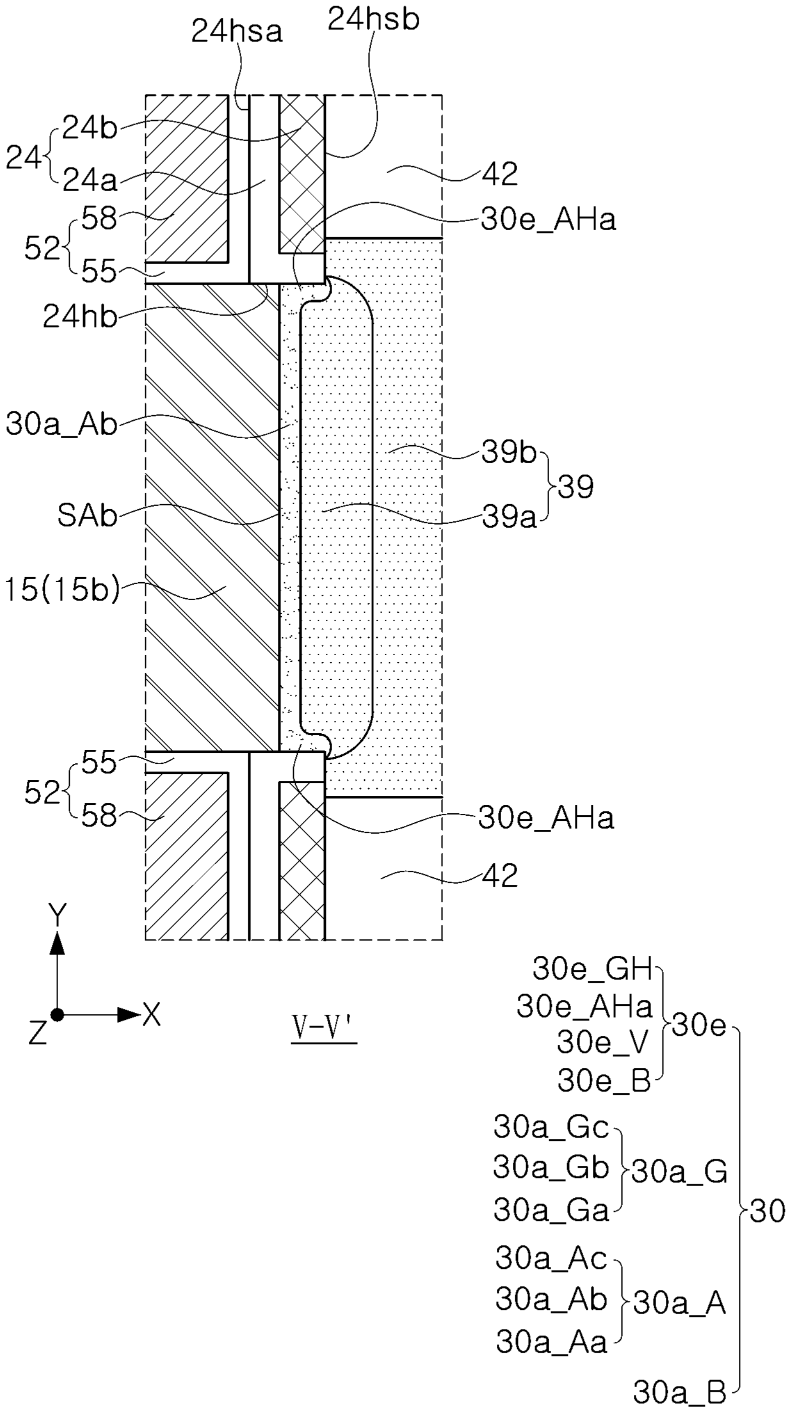
FIG. 9 is an enlarged cross-sectional view of a modified example of the semiconductor device of FIG. 1 in a plan view, illustrating a modified component of FIG. 5, according to an embodiment.

In the description below, a modified example of the second horizontal bent portion 30*e*_AH shown in FIG. 5 will be described with reference to FIG. 9. FIG. 9 is an enlarged cross-sectional view of a modified example of the semiconductor device of FIG. 1 in a plan view, illustrating a modified component of FIG. 5, according to an embodiment.

In a modified example, referring to FIG. 9, the at least one second horizontal bent portion 30*e*_AH (in FIG. 5) contacts the third side surface 24*hb* of the gate spacer 24 and spaced apart from the second side surface 24*hsb* of the gate spacer 24 may be modified to a second horizontal bent portion 30*e*_AHa extending from a portion contacting the third side surface 24*hb* of the gate spacer 24 and disposed on a portion of the second side surface 24*hsb* of the gate spacer 24. The second horizontal bent portion 30*e*_AHa may be spaced apart from the second spacer 24*b*. For example, the second horizontal bent portion 30*e*_AHa may not contact the second spacer 24*b*.

Figure 10A:
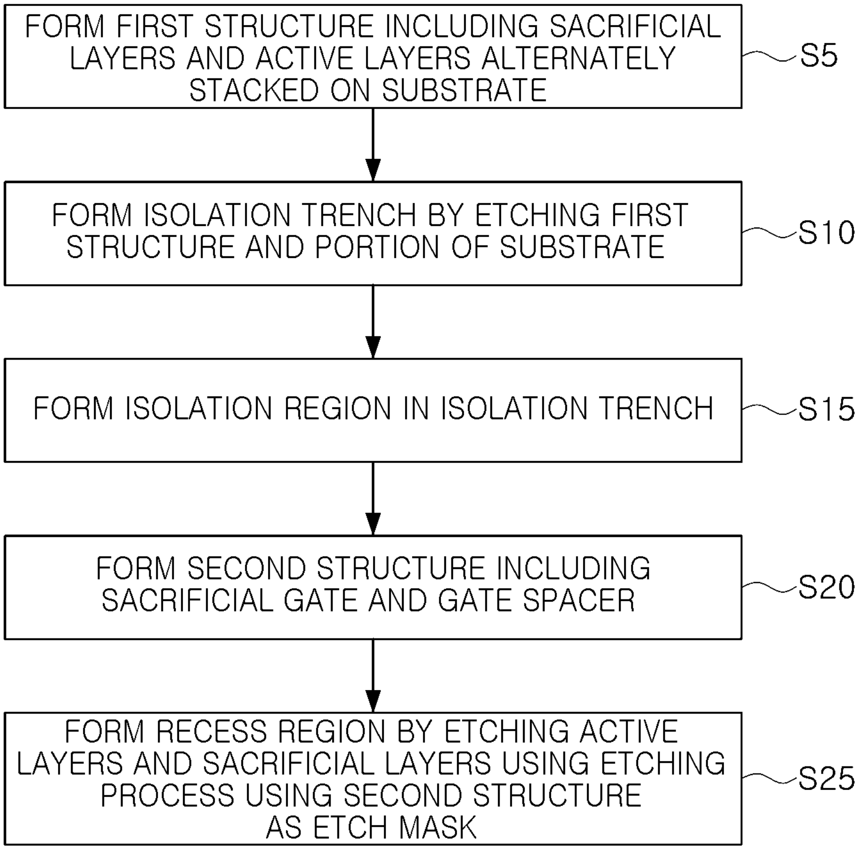
FIGS. 10A and 10B are flow charts illustrating an example of a method of manufacturing a semiconductor device, according to an embodiment.
Figure 10B:
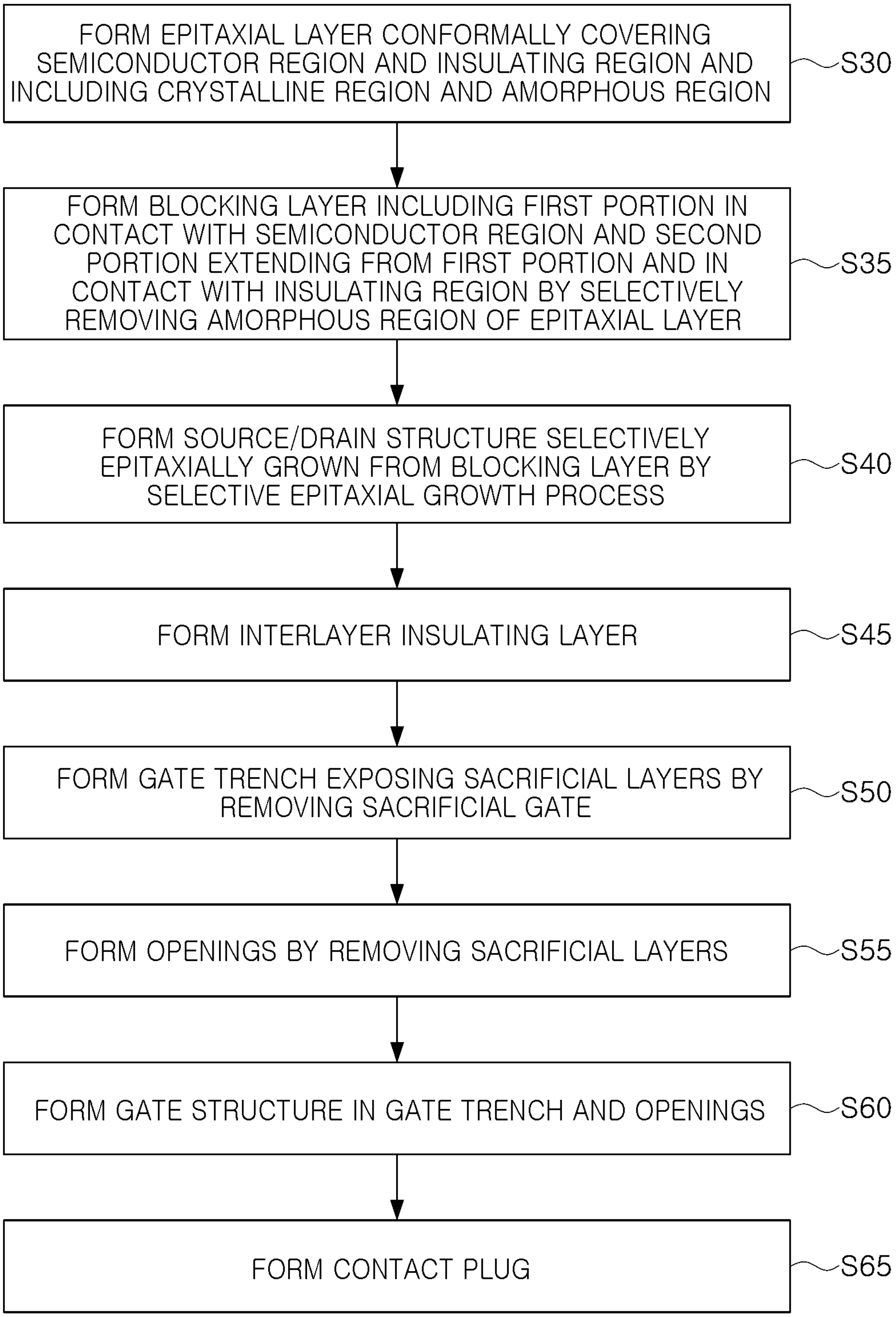

In the description below, an embodiment of a method of forming a semiconductor device according to an embodiment will be described with reference to FIGS. 10A, 10B, and 11A-11B to 15A-15B. FIGS. 10A and 10B are flow charts illustrating an example of a method of manufacturing a semiconductor device, according to an embodiment, and FIGS. 11A-11B to 15A-15B are cross-sectional views illustrating a method of forming the semiconductor device shown in FIG. 1 taken along lines I-I' and II-II', respectively, according to embodiments.

Figure 11A:
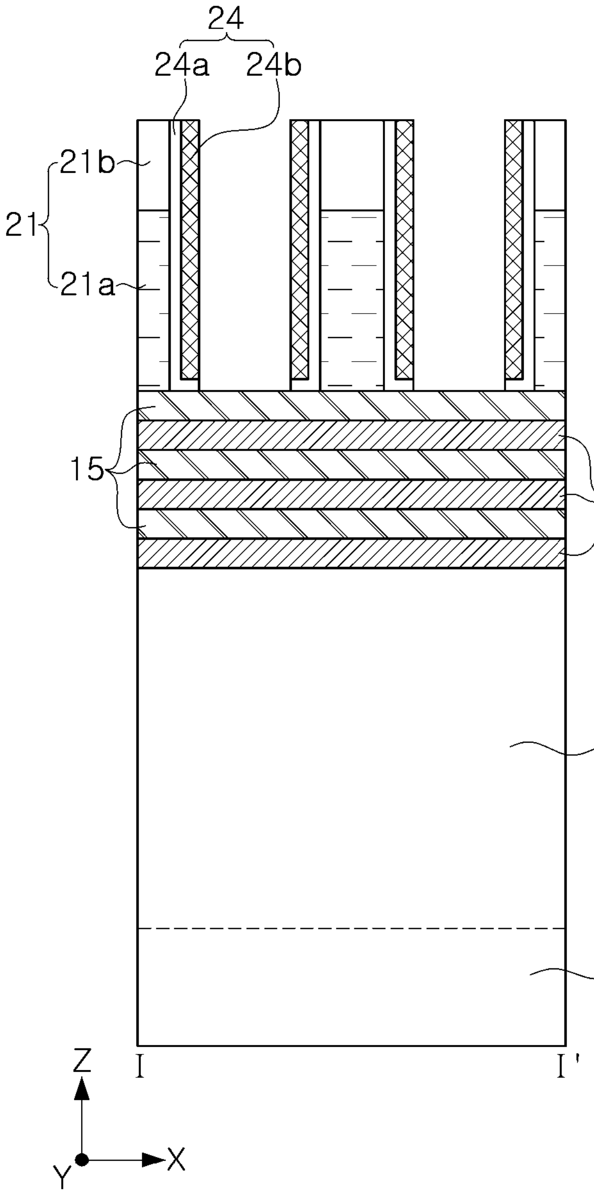
FIGS. 11A-11B to 15A-15B are cross-sectional views illustrating a method of forming the semiconductor device shown in FIG. 1 taken along lines I-I' and respectively, according to embodiments.
Figure 11B:
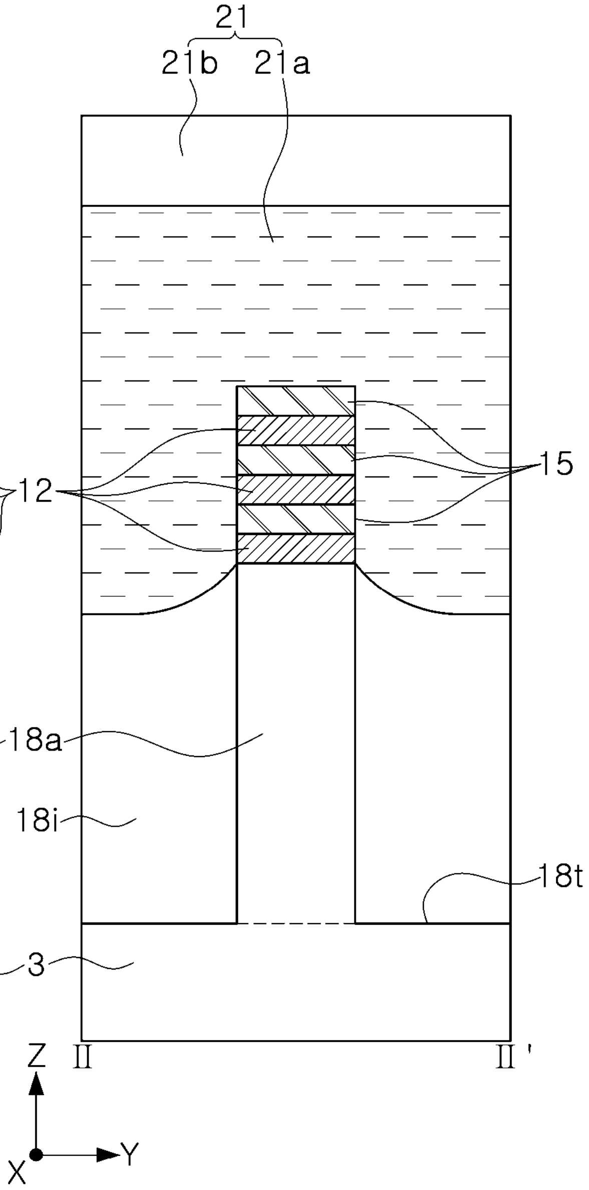

Referring to FIGS. 10A and 11A-11B, a first structure 12 and 15 including sacrificial layers 12 and active layers 15 alternately stacked on a substrate 3 may be formed (S5). In the first structure 12 and 15, a lowermost layer among the active layers 15 and the sacrificial layers 12 may be a sacrificial layer, and an uppermost layer may be an active layer. The sacrificial layers 12 may be replaced with the lower gate portions 52L as described with reference to FIGS. 2A and 3 through a subsequent process. Each of the active layers 15 may be formed as a first material layer using an epitaxial process, and each of the sacrificial layers 12 may be formed as a second material layer different from the first material layer using the epitaxial process. The first material layer of the active layers 15 may include a silicon layer, and the second material layer of the sacrificial layers 12 may include at least one of a SiGe layer and a Ge layer.

An isolation trench 18*t* may be formed by etching the first structure 12 and 15 and a portion of the substrate 3 (S10). An active region 18*a* formed below the first structure 12 and 15 may be defined by the isolation trench 18*t*. The active region 18*a* may have a bar shape or a line shape extending in the first horizontal direction X.

An isolation region 18*i* filling the isolation trench 18*t* and exposing side surfaces of the first structure 12 and 15 may be formed (S15). The isolation region 18*i* may be formed of an insulating material. For example, the isolation region 18*i* may include a low-κ dielectric, silicon oxide, silicon nitride, or another oxide or nitride compound, not being limited thereto.

A second structure 21 and 24 including a sacrificial gate 21 and a gate spacer 24 may be formed (S20).

The sacrificial gate 21 may intersect the first structure 12 and 15 and the active region 18*a*, and may extend in the second horizontal direction Y. The sacrificial gate 21 may include a first sacrificial gate 21*a* and a second sacrificial gate 21*b* stacked in order. The gate spacer 24 may be formed on a side surface of the sacrificial gate 21. The forming the gate spacer 24 may include conformally forming a first layer, conformally forming a second layer having a greater thickness than the thickness of the first layer, and anisotropically etching the first and second layers. The anisotropically etched first layer may be formed as a first spacer 24*a*, and the anisotropically etched second layer may be formed as a second spacer 24*b*.

Figure 12A:
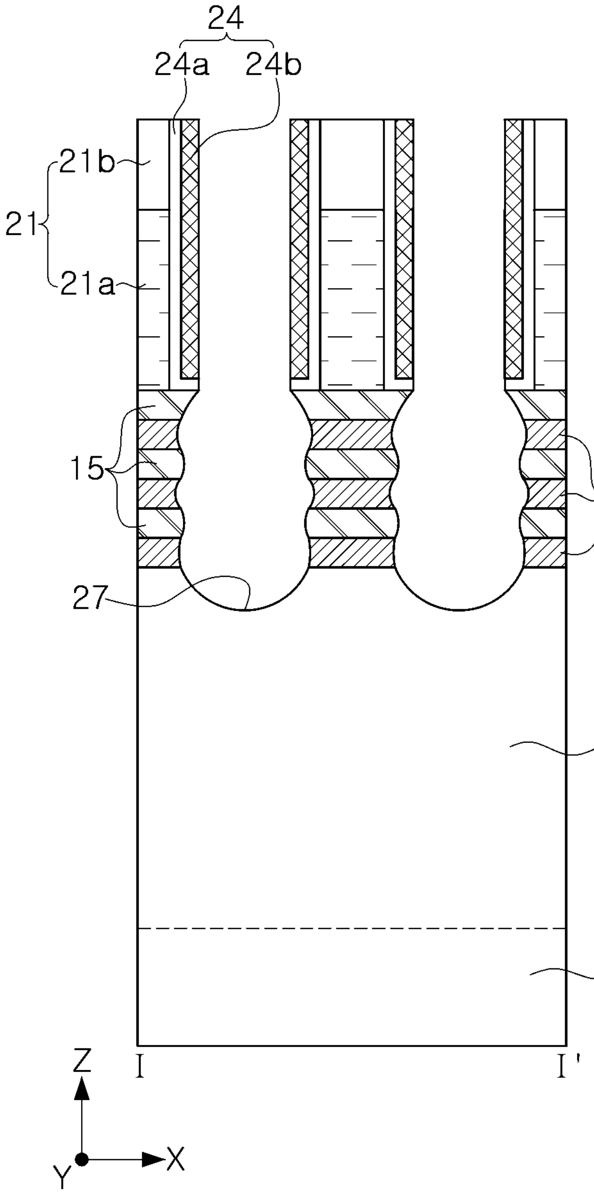
Figure 12B:
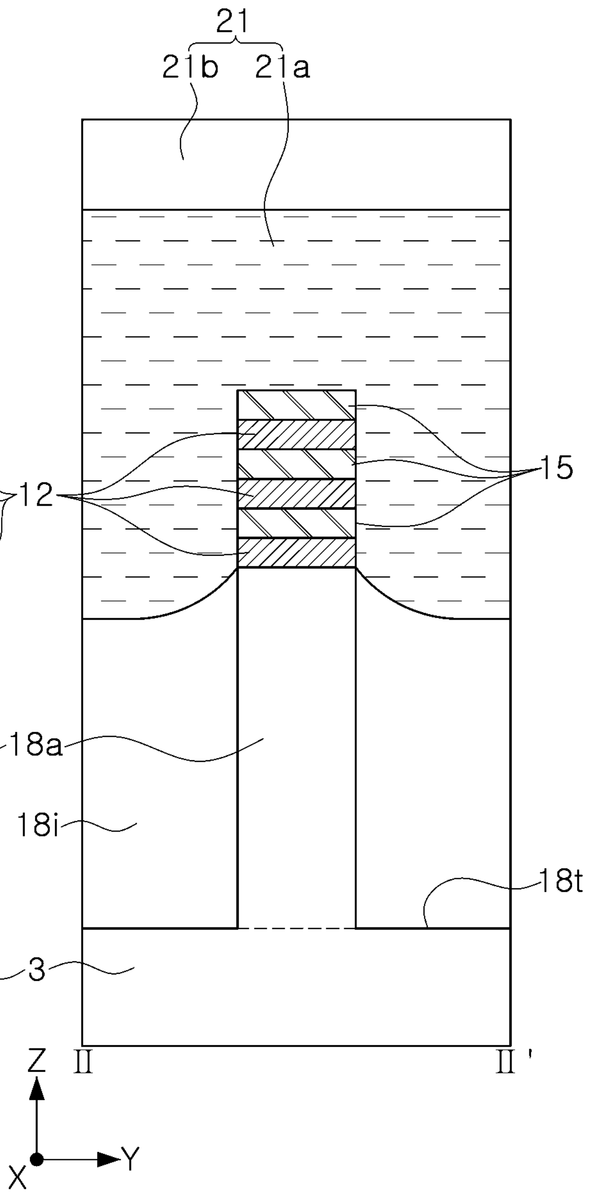

Referring to FIGS. 10A and 12, a recess region 27 may be formed by etching the active layers 15 and the sacrificial layers 12 using an etching process using the second structure 21 and 24 as an etch mask (S25). Depending on a difference in etching rates between the active layers 15 and the sacrificial layers 12, at least a portion of the side surfaces of the remaining active layers 15 may have an outwardly curved shape toward the recess region 27, and at least a portion of the side surfaces of the remaining sacrificial layers 12 may have an inwardly curved shape from the recess region 27.

According to an embodiment, the side surfaces of the active layers 15, the side surfaces of the sacrificial layers 12, and the active region 18*a* (e.g., the upper surface thereof) exposed by the recess region 27 may be referred to as semiconductor regions 12, 15, and 18*a*, and the surface of the gate spacer 24, the upper surface of the second sacrificial gate 21*b*, and the upper surface 18*s* (in FIG. 2C) of the isolation region 18*i* (in FIG. 2C) may be referred to as insulating regions 21*b* and 24 (18*s* in FIG. 2C).

Figure 13A:
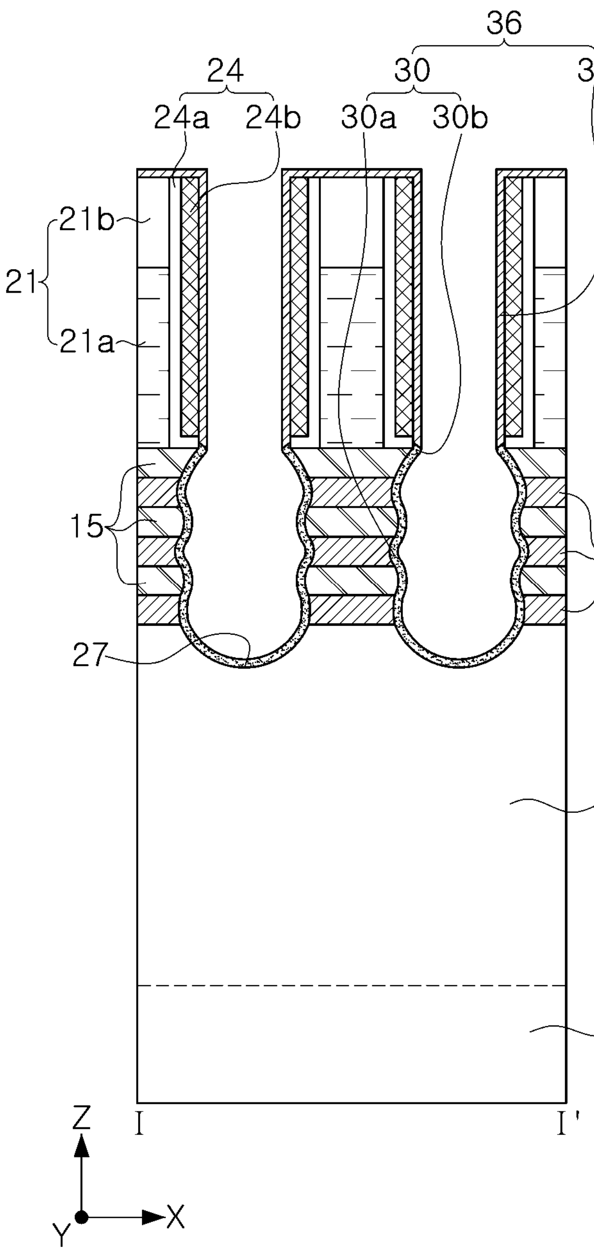
Figure 13B:
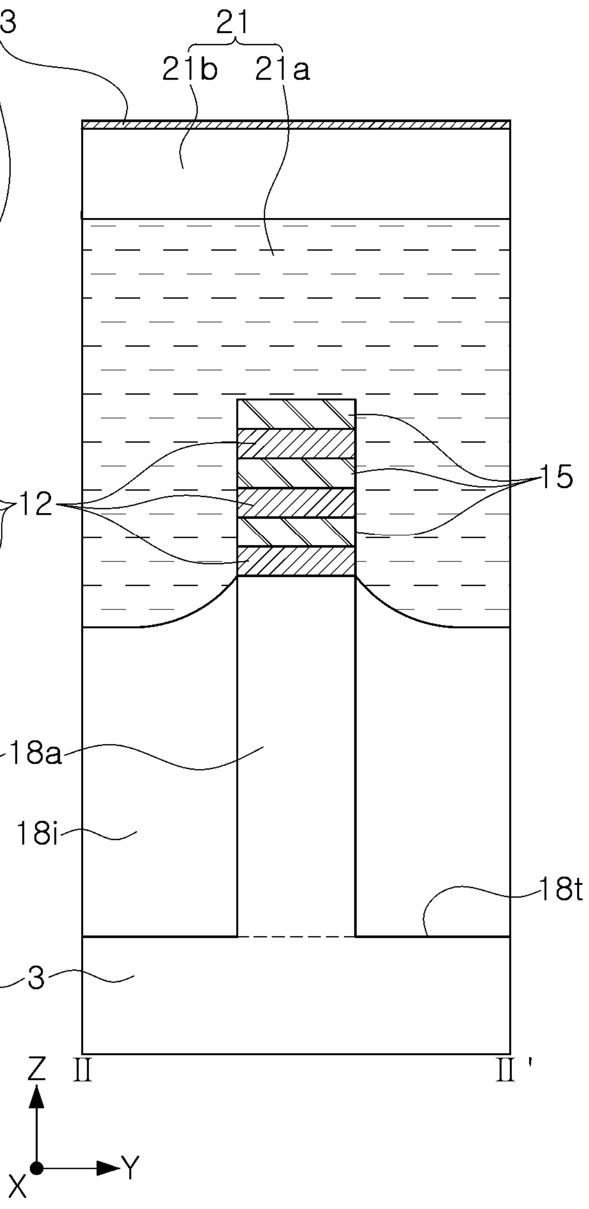

Referring to FIGS. 10B and 13, an epitaxial layer 36 conformally covering the semiconductor regions 12, 15, and 18*a* and the insulating regions 21*b*, 24 and 18*s* (in FIG. 2C), and including a crystalline region 30 and an amorphous region 33 may be formed (S30).

The epitaxial layer 36 may have a thickness ranging from about 1 nm to about 5 nm.

The crystalline region 30 may contact the semiconductor regions 12, 15, and 18*a*, may be disposed on the semiconductor regions 12, 15, and 18*a*, and may extend to the insulating regions 24 and 18*s* (in FIG. 2C) adjacent to the semiconductor regions 12, 15, and 18*a*. The amorphous region 33 may extend from the crystalline region 30 and may be disposed on the insulating regions 21*b*, 24, and 18*s* (in FIG. 2C).

The crystalline region 30 may include a first portion 30*a* contacting the semiconductor regions 12, 15, and 18*a* and a second portion 30*b* extending from the first portion 30*a* to the insulating regions 24 and 18*s* (in FIG. 2C) adjacent to the semiconductor regions 12, 15, and 18*a*.

In the epitaxial layer 36, the crystalline region 30 may be formed of crystalline silicon, and the amorphous region 33 may be formed of amorphous silicon.

The crystalline region 30 may be included in the blocking layer 30 of one of embodiments described with reference to FIGS. 1 to 9. For example, in the crystalline region 30, the first portion 30*a* may be included in the plurality of active blocking portions 30*a*_A, the plurality of gate blocking portions 30*a*_G, and the lower blocking portion 30*a*_B as illustrated in FIG. 3, and the second portion 30*b* may be included in the at least one bent portion 30*e* as illustrated in FIG. 2C and FIGS. 3 to 5.

Figure 14A:
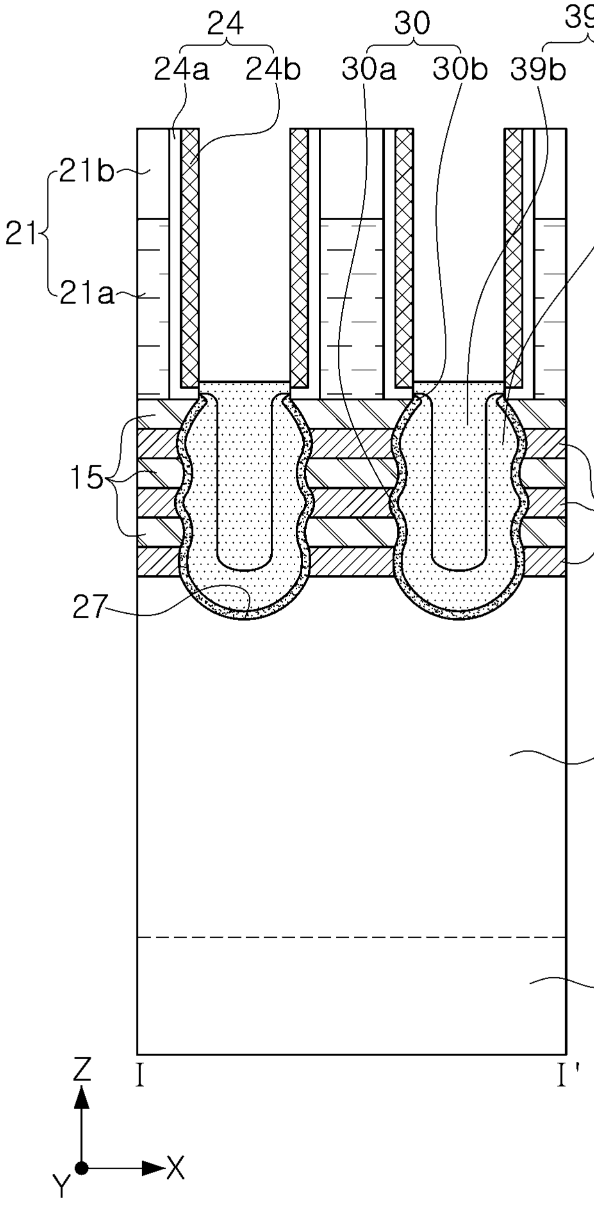
Figure 14B:
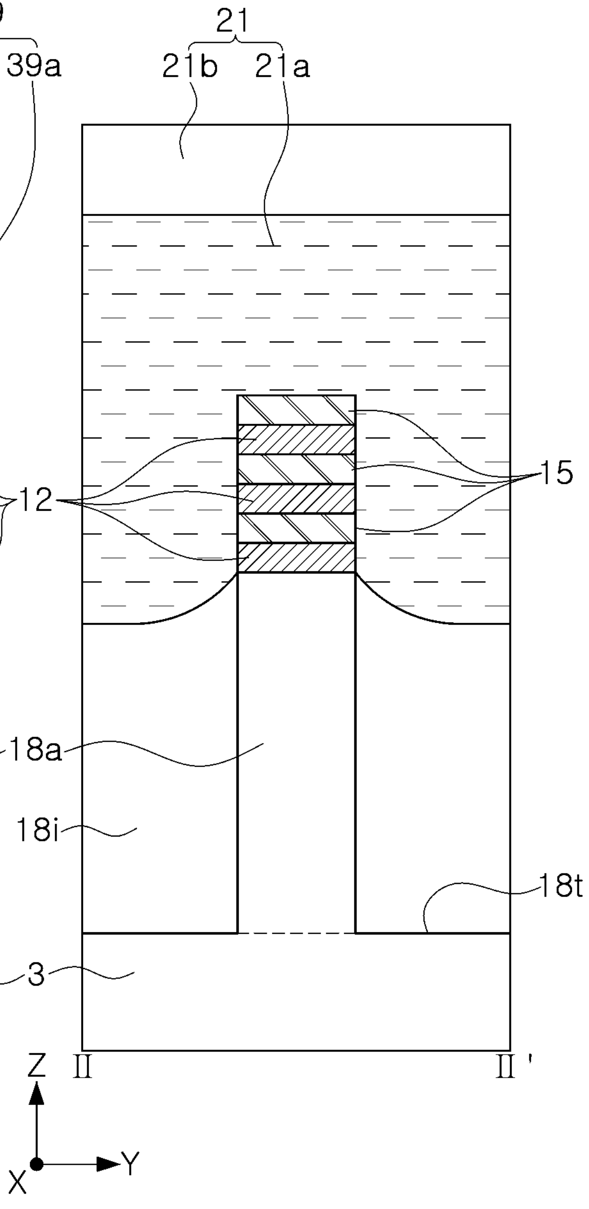
Figures 15A, 15B:
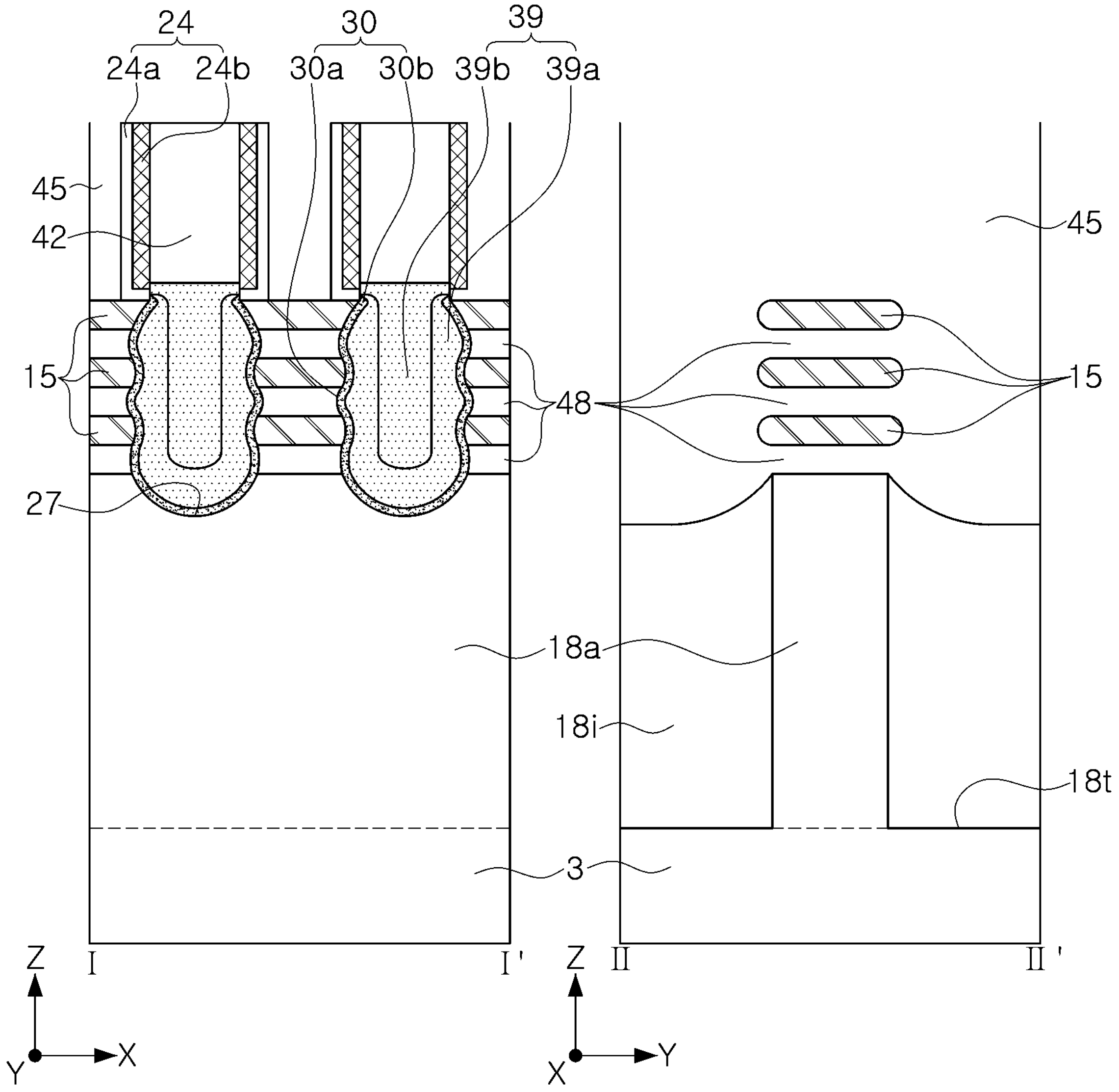

Referring to FIGS. 10B and 14, by selectively removing the amorphous region 33 (in FIG. 13) of the epitaxial layer 36 (in FIG. 13), the blocking layer 30 may be formed to include the first portion 30*a* contacting the semiconductor regions 12, 15, and 18*a* and the second portion 30*b* extending from the first portion 30*a* and contacting the insulating regions 24 and 18*s* (in FIG. 2C) (S35). That is, the crystalline region 30 in FIG. 13 may remain and may be formed as the blocking layer 30.

A source/drain structure 39 selectively epitaxially grown from the blocking layer 30 may be formed by a selective epitaxial growth process (S40). The source/drain structure 39 may include a first source/drain epitaxial layer 39*a* selectively epitaxially grown from the blocking layer 30 and a second source/drain epitaxial layer 39*b* selectively epitaxially grown from the first source/drain epitaxial layer 39*a*. The first source/drain epitaxial layer 39*a* may be formed of a first SiGe material, and the second source/drain epitaxial layer 39*b* may be formed of a second SiGe material having a composition different from that of the first SiGe material. A Ge concentration of the second SiGe material may be higher than a Ge concentration of the first SiGe material.

Referring to FIGS. 10B and 15, an interlayer insulating layer 42 (in FIGS. 2A and 2C) may be formed (S45). The forming the interlayer insulating layer 42 (in FIGS. 2A and 2C) may include forming an insulating layer on the substrate 3 formed up to the source/drain structure 39 and planarizing the insulating layer. While forming the interlayer insulating layer 42 (in FIGS. 2A and 2C) or after forming the interlayer insulating layer 42 (in FIGS. 2A and 2C), the second sacrificial gate 21B (in FIG. 14) may be removed, and the level of the gate spacer 24 may be reduced.

A gate trench 45 exposing the sacrificial layers 12 (in FIG. 14) may be formed by removing the sacrificial gate 21 (in FIG. 14) (S50). The removing the sacrificial gate 21 (in FIG. 14) may include exposing the first sacrificial gate 21 (in FIG. 14) by removing the second sacrificial gate (21*b* in FIG. 14) while forming the interlayer insulating layer 42 (in FIGS. 2A and 2C) or after forming the interlayer insulating layer 42 (in FIGS. 2A and 2C), and removing the exposed first sacrificial gate 21*a* (in FIG. 14).

By removing the sacrificial layers 12 (in FIG. 14), openings 48 may be formed (S55). A portion of the blocking layer 30 may be exposed while removing the sacrificial layers 12 (in FIG. 14). The source/drain structure 39 may not be exposed by the openings 48 due to the blocking layer 30.

Referring to FIGS. 1 to 5, in addition to FIG. 10B, a gate structure 52 may be formed in the gate trench 45 (in FIG. 15) and the openings 48 (in FIG. 15) (S60). The gate structure 52 may fill the gate trench 45 (in FIG. 15) and the openings 48 (in FIG. 15), and may include the gate dielectric layer 55 and the gate electrode 58 described with reference to FIGS. 1 to 5. A contact plug 70 may be formed (S65). The contact plug 70 may penetrate through the interlayer insulating layer 42 and may be electrically connected to the source/drain structure 39.

According to the aforementioned embodiments, a semiconductor device including a blocking layer which may prevent a leakage current that may be generated between a gate electrode and a source/drain structure or electrical short that may be generated between a gate electrode and a source/drain structure may be provided.

While the embodiments have been illustrated and described above, it will be configured as apparent to those skilled in the art that modifications and variations could be made without departing from the scope of the present disclosure as defined by the appended claims.

What is claimed is:

1. A semiconductor device, comprising:
- a plurality of active layers stacked and spaced apart from each other in a vertical direction;
- an epitaxial structure connected to the plurality of active layers;
- a gate structure surrounding the plurality of active layers; and
- a gate spacer on a side surface of the gate structure,
- wherein the epitaxial structure comprises a blocking layer and a source/drain structure on the blocking layer,
- wherein the blocking layer comprises a plurality of active blocking portions and a first bent portion,
- wherein the plurality of active blocking portions contact the plurality of active layers,
- wherein the plurality of active blocking portions comprise a first active blocking portion contacting a first active layer among the plurality of active layers, and
- wherein, in a plan view, the first bent portion of the blocking layer:
  - extends from the first active blocking portion;
  - is bent from the first active blocking portion in a direction away from the first active layer; and
  - contacts the gate spacer.

2. The semiconductor device of claim 1, wherein the first active layer is an upper active layer among the plurality of active layers,
- wherein the gate spacer comprises a first side surface contacting the gate structure, a second side surface opposite to the first side surface, and a third surface contacting an upper surface of the upper active layer, and
- wherein the blocking layer further comprises an upper portion contacting a portion of the second side surface of the gate spacer.

3. The semiconductor device of claim 1,
- wherein the gate spacer comprises a first spacer and a second spacer,
- wherein the first spacer comprises a vertical portion between the second spacer and the gate structure, and a lower portion between the second spacer and the first active layer, and
- wherein the first bent portion contacts the first spacer.

4. The semiconductor device of claim 3, wherein the first bent portion is spaced apart from the second spacer.

5. The semiconductor device of claim 4, wherein the source/drain structure contacts the first spacer and the second spacer.

6. The semiconductor device of claim 4,
- wherein the gate structure comprises:
  - a plurality of lower gate portions below the plurality of active layers, respectively; and
  - an upper gate portion above an upper active layer among the plurality of active layers,
- wherein the blocking layer further comprises a plurality of gate blocking portions contacting the plurality of lower gate portions, respectively,
- wherein the plurality of gate blocking portions comprise a first gate blocking portion contacting a first lower gate portion among the plurality of lower gate portions, and
- wherein the blocking layer further comprises a second bent portion,
- wherein, in a plan view, the second bent portion of the blocking layer:
  - extends from the first gate blocking portion;
  - is bent from the first gate blocking portion in a direction away from the first lower gate portion; and
  - contacts the gate spacer.

7. The semiconductor device of claim 6,
- wherein the gate structure comprises a gate dielectric layer and a gate electrode on the gate dielectric layer,
- wherein, in the plan view, the gate spacer comprises a first side surface, a second side surface opposite to the first side surface, and a third side surface extending from end portions of the first and second side surfaces and connecting the end portions to each other,
- wherein the first side surface of the gate spacer contacts the gate dielectric layer,
- wherein the third side surface of the gate spacer contacts the gate dielectric layer, the first gate blocking portion, and the second bent portion, and
- wherein the second side surface of the gate spacer contacts the source/drain structure.

8. The semiconductor device of claim 7, wherein the second side surface of the gate spacer is spaced apart from the first gate blocking portion and the second bent portion.

9. The semiconductor device of claim 7, wherein the second side surface of the gate spacer contacts the second bent portion and the source/drain structure.

10. The semiconductor device of claim 1,
wherein the gate structure comprises a gate dielectric layer and a gate electrode on the gate dielectric layer,
wherein, in the plan view, the gate spacer comprises a first side surface, a second side surface opposite to the first side surface, and a third side surface extending from end portions of the first and second side surfaces and connecting the end portions to each other,
wherein the first side surface of the gate spacer contacts the gate dielectric layer,
wherein the third side surface of the gate spacer contacts the first active layer, the first active blocking portion, and the first bent portion, and
wherein the second side surface of the gate spacer contacts the source/drain structure.

11. The semiconductor device of claim 10, wherein the second side surface of the gate spacer is spaced apart from the first active blocking portion and the first bent portion.

12. The semiconductor device of claim 10, wherein the second side surface of the gate spacer contacts the first bent portion and the source/drain structure.

13. The semiconductor device of claim 1, further comprising:
an active region comprising a first portion and a second portion;
an isolation region on a side surface of the active region,
wherein the epitaxial structure is disposed on the first portion of the active region,
wherein the plurality of active layers are disposed on the second portion of the active region,
wherein the blocking layer further comprises a lower blocking portion between the active region and the source/drain structure,
wherein the blocking layer further comprises a lower bent portion extending from the lower blocking portion and bent from the lower blocking portion,
wherein the lower bent portion contacts an upper surface of the isolation region, and
wherein a lower end portion of the lower bent portion is at a lower level than the lower blocking portion.

14. The semiconductor device of claim 1,
wherein the blocking layer comprises a silicon layer,
wherein the source/drain structure comprises a first source/drain epitaxial layer and a second source/drain epitaxial layer on the first source/drain epitaxial layer,
wherein the first source/drain epitaxial layer includes a first silicon germanium layer, and
wherein the second source/drain epitaxial layer includes a second silicon germanium layer different from the first silicon germanium layer.

15. A semiconductor device, comprising:
an active region comprising a first portion and a second portion;
an isolation region on a side surface of the active region;
a plurality of active layers stacked and spaced apart from each other in a vertical direction and on the first portion of the active region;
an epitaxial structure disposed on the second portion of the active region, connected to the plurality of active layers, and overlapping the isolation region in the vertical direction;
a gate structure surrounding the plurality of active layers; and
a gate spacer on a side surface of the gate structure,
wherein the gate structure includes:
a plurality of lower gate portions below the plurality of active layers, respectively; and
an upper gate portion on an upper active layer among the plurality of active layers,
wherein the epitaxial structure comprises a blocking layer and a source/drain structure on the blocking layer,
wherein the blocking layer comprises:
a plurality of active blocking portions contacting the plurality of active layers, respectively;
a plurality of gate blocking portions contacting the plurality of lower gate portions, respectively; and
at least one, and
wherein, in a plan view, the gate spacer comprises a first side surface contacting the gate structure, a second side surface opposite to the first side surface, and a third side surface extending from end portions of the first and second side surfaces and connecting the end portions to each other, and
wherein, in a plan view, the at least one bent portion of the blocking layer:
extends from at least one of the plurality of active blocking portions and the plurality of gate blocking portions;
is bent in a direction away from the first side surface of the gate spacer toward the second side surface of the gate spacer; and
contacts the third side surface of the gate spacer.

16. The semiconductor device of claim 15,
wherein the blocking layer comprises a silicon layer, and
wherein the source/drain structure comprises a silicon germanium layer.

17. The semiconductor device of claim 15,
wherein the gate spacer comprises a first spacer and a second spacer,
wherein the first spacer comprises a vertical portion between the second spacer and the gate structure, and a lower portion between the second spacer and an upper active layer among the plurality of active layers,
wherein the at least one bent portion contacts the first spacer and is spaced apart from the second spacer, and
wherein the source/drain structure contacts the first spacer and the second spacer.

18. A semiconductor device, comprising:
a plurality of active layers stacked and spaced apart from each other in a vertical direction;
an epitaxial structure connected to the plurality of active layers;
a gate structure surrounding the plurality of active layers; and
a gate spacer on a side surface of the gate structure,
wherein the gate structure comprises:
a plurality of lower gate portions below the plurality of active layers, respectively; and
an upper gate portion above an upper active layer among the plurality of active layers,
wherein the epitaxial structure comprises a blocking layer and a source/drain structure on the blocking layer, wherein the blocking layer comprises:

blocking portions including a plurality of active blocking portions and a plurality of gate blocking portions; and at least one bent portion, wherein the plurality of active blocking portions contact the plurality of active layers, respectively, wherein the plurality of gate blocking portions contact the plurality of lower gate portions, respectively, wherein, in a plan view, the gate spacer comprises a first side surface contacting the gate structure, a second side surface opposite to the first side surface, and a third side surface extending from end portions of the first and second side surfaces and connecting the end portions to each other, and wherein, in a plan view, the at least one bent portion of the blocking layer extends from at least one of the blocking portions;

is bent in a direction away from the first side surface of the gate spacer toward the second side surface of the gate spacer; and contacts the third side surface of the gate spacer.

19. The semiconductor device of claim 18, wherein the blocking layer comprises a silicon layer doped with at least one of carbon (C), oxygen (O), nitrogen (N), and fluorine (F), wherein the source/drain structure comprises a silicon germanium layer having p-type conductivity, and wherein a thickness of the blocking layer is in a range of about 1 nm to about 5 nm.

20. The semiconductor device of claim 18, wherein the gate spacer comprises a first spacer and a second spacer, wherein the first spacer comprises a vertical portion between the second spacer and the gate structure, and a lower portion between the second spacer and an upper active layer among the plurality of active layers, wherein the at least one bent portion contacts the first spacer and is spaced apart from the second spacer, and wherein the source/drain structure contacts the first spacer and the second spacer.

* * * * *